(12) United States Patent
Ha et al.

(10) Patent No.: US 7,727,458 B2
(45) Date of Patent: Jun. 1, 2010

(54) METHOD OF FORMING A CHALCOGENIDE COMPOUND TARGET

(75) Inventors: Yong-Ho Ha, Gyeonggi-do (KR);
Bong-Jin Kuh, Gyeonggi-do (KR);
Han-Bong Ko, Gyeongg-do (KR);
Doo-Hwan Park, Gyeonggi-do (KR);
Sang-Wook Lim, Gyeonggi-do (KR);
Hee-Ju Shin, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 156 days.

(21) Appl. No.: 11/860,931

(22) Filed: Sep. 25, 2007

(65) Prior Publication Data

US 2008/0075844 A1    Mar. 27, 2008

(30) Foreign Application Priority Data

Sep. 27, 2006    (KR) ...................... 10-2006-0094217

(51) Int. Cl.
*C04B 35/64* (2006.01)
(52) U.S. Cl. ............................ 264/603; 501/87; 501/93; 252/516
(58) Field of Classification Search ................... 264/603
See application file for complete search history.

(56) References Cited

U.S. PATENT DOCUMENTS 6,987,467 B2    1/2006    Romeo et al.

2002/0172139 A1 *   11/2002   Kondo et al. ............. 369/275.4
2007/0099332 A1 *   5/2007    Kardokus et al. ............. 438/95

FOREIGN PATENT DOCUMENTS

| KR | 10-2004-0004137 A | 1/2004 |
|----|-------------------|--------|
| KR | 10-2004-0076225 A | 8/2004 |
| KR | 10-2006-0001105 A | 1/2006 |
| KR | 546406            | 1/2006 |
| RU | 1401918 A1 *      | 2/1994 |

* cited by examiner

*Primary Examiner*—Steven P Griffin
*Assistant Examiner*—Erin Snelting
(74) *Attorney, Agent, or Firm*—Myers Bigel Sibley & Sajovec, PA

(57) ABSTRACT

In a method of forming a chalcogenide compound target, a first powder including germanium carbide or germanium is prepared, and a second powder including antimony carbide or antimony is prepared. A third powder including tellurium carbide or tellurium is prepared. A powder mixture is formed by mixing the first to the third powders. After a shaped is formed body by molding the powder mixture. The chalcogenide compound target is obtained by sintering the powder mixture. The chalcogenide compound target may include a chalcogenide compound that contains carbon and metal, or carbon, metal and nitrogen considering contents of carbon, metal and nitrogen, so that a phase-change material layer formed using the chalcogenide compound target may stable phase transition, enhanced crystallized temperature and increased resistance. A phase-change memory device including the phase-change material layer may have reduced set resistance and driving current while improving durability and sensing margin.

17 Claims, 7 Drawing Sheets

METHOD OF FORMING A CHALCOGENIDE COMPOUND TARGET

CROSS-REFERENCE TO RELATED APPLICATION

This application claims priority under 35 USC §119 to Korean Patent Application No. 2006-94217 filed on Sep. 27, 2006, the contents of which are incorporated herein by reference in their entirety.

FIELD OF THE INVENTION

Example embodiments of the present invention relate to a chalcogenide compound target, a method of forming the chalcogenide compound target, and a method of manufacturing a phase-change memory device. More particularly, example embodiments of the present invention relate to a chalcogenide compound target including a chalcogenide compound having proper contents of ingredient, and a method of forming the chalcogenide compound target, and a method of manufacturing a phase-change memory device including a phase-change material layer obtained using the chalcogenide compound target.

BACKGROUND OF THE INVENTION

Semiconductor memory devices are generally divided into volatile semiconductor memory devices such as dynamic random access memory (DRAM) devices or static random access memory (SRAM) devices, and non-volatile semiconductor memory devices such as flash memory devices or electrically erasable programmable read only memory (EEPROM) devices. The volatile semiconductor memory device loses data stored therein when power is off. However, the non-volatile semiconductor memory device keeps stored data even if power is out.

Among the non-volatile semiconductor memory devices, the flash memory device has been widely employed in various electronic apparatuses such as a digital camera, a cellular phone, an MP3 player, etc. Since a programming process and a reading process of the flash memory device take a relatively long time, technologies to manufacture a novel semiconductor memory device, for example, a magnetic random access memory (MRAM) device, a ferroelectric random access memory (FRAM) device or a phase-change random access memory (PRAM) device, have been constantly developed.

The phase-change memory device stores information using a resistance difference between an amorphous phase and a crystalline phase of a phase-change material layer composed of a chalcogenide compound, e.g., germanium-antimony-tellurium (GST). Particularly, the PRAM device may store data as states of "0" and "1" using a reversible phase transition of the phase-change material layer. The amorphous phase of the phase-change material layer has a large resistance, whereas the crystalline phase of the phase-change material layer has a relatively small resistance. In the PRAM device, a transistor formed on a substrate may provide the phase-change material layer with a reset current ($I_{reset}$) for changing the phase of the phase-change material layer from the crystalline state into the amorphous state. The transistor may also supply the phase-change material layer with a set current ($I_{set}$) for changing the phase of the phase-change material layer from the amorphous state into the crystalline state. The conventional PRAM device is disclosed in U.S. Pat. No. 6,987,467, Korean Patent No. 546,406 and Korean Laid-Open Patent Publication No. 2006-1105.

In the conventional PRAM device, however, the phase-change material layer may not have proper properties so that the PRAM device may not have desired electrical characteristics. For example, the phase-change material layer may be rapidly deteriorated, to thereby considerably reduce data retention characteristics of the PRAM device. Additionally, the PRAM device may have a relatively great ser resistance when the phase-change material layer includes a normal GST compound.

Considering the above-mentioned problems, a phase-change material layer has been formed using a chalcogenide compound doped into additional elements such as nitrogen in order to improve electrical characteristics of a PRAM device including the phase-change material layer. For example, Korean Laid-Open Patent Publication 2004-76225 discloses a phase-change memory device including a phase-change material layer composed of a GST compound doped with nitrogen. However, in the above-mentioned phase-change memory device having the phase-change material layer pattern of the GST compound doped with nitrogen, the phase-change memory device may have a considerably large initial writing current although a set resistance of the phase-change memory device may be decreased. To improve an integration degree of the phase-change memory device, a driving current of the phase-change memory device needs to be reduced. However, the set resistance of the phase-change memory device may be greatly increased in accordance with a reduction of the driving current thereof when the phase-change material layer pattern of the phase-change memory device includes the GST compound doped with nitrogen only. Further, the phase-change memory device of GST compound doped with nitrogen may not ensure good adhesion strength relative to the first electrode and the second electrode. Thus, the first electrode and/or the second electrode may be separated from the phase-change material layer pattern, and also an interface resistance between the first electrode and the phase-change material layer pattern or the second electrode and the phase-change material layer pattern may be undesirably reduced.

Meanwhile, Korean Laid-Open Patent Publication No. 2005-4137 discloses a sputtering target for forming a phase-change memory layer including a GST compound that contains nitrogen. However, the sputtering target includes carbon with a low content so that the phase-change memory layer may not have sufficient carbon content when the phase-change memory layer is formed using the sputtering target. As a result, the phase-change memory layer may not have desired thermal and electrical characteristics when the phase-change memory layer is employed in a phase-change memory device.

SUMMARY OF THE INVENTION

Example embodiments of the present invention provide a chalcogenide compound target including a chalcogenide compound that contains carbon and metal, or carbon, metal and nitrogen considering contents of carbon, metal and nitrogen.

Example embodiments of the present invention provide a method of forming a chalcogenide compound target including a chalcogenide compound that contains carbon and metal, or carbon, metal and nitrogen considering contents of carbon, metal and nitrogen.

Example embodiments of the present invention provide a method of manufacturing a phase-change memory device having a phase-change material layer formed using the chalcogenide compound target to ensure improved electrical characteristics and reliability According to one aspect of the present invention, there is provided a chalcogenide compound target including a chalcogenide compound that contains carbon with a relatively high content and metal with a relatively low content.

In some example embodiments, the chalcogenide compound may have a composition in accordance with the following chemical formula (1):

$$C_A M_B [Ge_X Sb_Y Te_{(100-X-Y)}]_{(100-A-B)} \quad (1)$$

In the above chemical formula (1), C indicates carbon, M represents metal, $8.0 \leq A \leq 40.0$, $0.1 \leq B \leq 20.0$, $0.1 \leq X \leq 30.0$ and $0.1 \leq Y \leq 90.0$. Examples of metal may include aluminum (Al), gallium (Ga), chrome (Cr), manganese (Mn), iron (Fe), cobalt (Co), nickel (Ni), zirconium (Zr), molybdenum (Mo), ruthenium (Ru), palladium (Pd), hafnium (Hf), tantalum (Ta), iridium (Ir), platinum (Pt). These may be used alone or in a mixture thereof.

In some example embodiments, the chalcogenide compound target may include a chalcogenide compound according to the following chemical formula (2) in which germanium in the chemical formula (1) is substituted with germanium and silicon (Si) or germanium and tin (Sn):

$$C_A M_B [Ge_X Z_{(100-X)} Sb_Y Te_{(100-X-Y)}]_{(100-A-B)} \quad (2)$$

In the above chemical formula (2), Z includes silicon or tin, $0.1 \leq X \leq 80.0$, and $0.1 \leq Y \leq 90.0$.

In some example embodiments, the chalcogenide compound target may include a chalcogenide compound according to the following chemical formula (3) in which antimony in the chemical formula (1) is substituted with antimony and arsenic (As) or antimony and bismuth (Bi):

$$C_A M_B [Ge_X Sb_Y T_{(100-Y)} Te_{(100-X-Y)}]_{(100-A-B)} \quad (3)$$

In the above chemical formula (3), T includes arsenic or bismuth, $0.1 \leq X \leq 90.0$, and $0.1 \leq Y \leq 80.0$.

In some example embodiments, the chalcogenide compound target may include a chalcogenide compound according to the following chemical formula (4) in which tellurium in the chemical formula (1) is substituted with antimony and selenium (Se):

$$C_A M_B [Ge_X Sb_Y Q_{(100-X-Y)}]_{(100-A-B)} \quad (4)$$

In the above chemical formula (4), Q includes antimony and selenium, $0.1 \leq X \leq 30.0$, $0.1 \leq Y \leq 90.0$, Q includes antimony and selenium, and $0.1 \leq D \leq 80.0$.

According to another aspect of the present invention, there is provided a chalcogenide compound target including a chalcogenide compound that contains carbon with a relatively high content, metal with a relatively low content, and nitrogen with a relatively low content.

In some example embodiments, the chalcogenide compound may have a composition in accordance with the following chemical formula (5):

$$C_A M_B N_C [Ge_X Sb_Y Te_{(100-X-Y)}]_{(100-A-B-C)} \quad (5)$$

In the above chemical formula (5), C means carbon, M denotes metal, N indicates nitrogen $8.0 \leq A \leq 40.0$, $0.1 \leq B \leq 15.0$, $0.1 \leq C \leq 10.0$, $0.1 \leq X \leq 30.0$ and $0.1 \leq Y \leq 90.0$.

In some example embodiments, the chalcogenide compound target may include a chalcogenide compound according to the following chemical formula (6) in which germanium in the chemical formula (5) is substituted with germanium and silicon or germanium and tin:

$$C_A M_B N_C [Ge_X Z_{(100-X)} Sb_Y Te_{(100-X-Y)}]_{(100-A-B-C)} \quad (6)$$

In the above chemical formula (6), Z includes silicon or tin, $0.1 \leq X \leq 80.0$ and $0.1 \leq Y \leq 90.0$.

In some example embodiments, the chalcogenide compound target may include a chalcogenide compound according to the following chemical formula (7) in which antimony in the chemical formula (5) is substituted with antimony and arsenic or antimony and bismuth:

$$C_A M_B N_C [Ge_X Sb_Y T_{(100-Y)} Te_{(100-X-Y)}]_{(100-A-B-C)} \quad (7)$$

In the above chemical formula (7), T includes arsenic or bismuth, $0.1 \leq X \leq 90.0$ and $0.1 \leq Y \leq 80.0$.

In some example embodiments, the chalcogenide compound target may include a chalcogenide compound according to the following chemical formula (8) in which tellurium in the chemical formula (5) is substituted with antimony and selenium:

$$C_A M_B N_C [Ge_X Sb_Y Q_{(100-X-Y)}]_{(100-A-B)} \quad (8)$$

In the above chemical formula (8), Q includes antimony and selenium, $0.1 \leq X \leq 30.0$, $0.1 \leq Y \leq 90.0$, Q includes antimony and selenium, and $0.1 \leq D \leq 80.0$.

According to still another aspect of the present invention, there is provided a method of forming a chalcogenide compound target. In the method of forming the chalcogenide compound target, a first powder including germanium carbide or germanium is formed. A second powder including antimony carbide or antimony is prepared. A third powder including tellurium carbide or tellurium is formed. After a powder mixture by mixing the first to the third powders, the powder mixture is dried. A shaped body is formed by molding the powder mixture, and then the shaped body is sintered to obtain the a chalcogenide compound target.

In some example embodiments, the germanium carbide may have a composition in accordance with the following chemical formula (9):

$$C_A Ge_{(100-A)} \quad (9)$$

In the above chemical formula (9), C indicates carbon and $8.0 \leq A \leq 50.0$.

In some example embodiments, the germanium carbide may have a composition according to the following chemical formula (10) in which germanium in the chemical formula (9) is substituted with germanium and silicon (Si) or germanium and tin (Sn):

$$C_A [Ge_X Z_{(100-X)}]_{(100-A)} \quad (10)$$

In the above chemical formula (10), Z includes silicon or tin and $0.1 \leq X \leq 80.0$.

In some example embodiments, the antimony carbide may have a composition in accordance with the following chemical formula (11):

$$C_A Sb_{(100-A)} \quad (11)$$

In the above chemical formula (11), C indicates carbon and $8.0 \leq A \leq 50.0$.

In some example embodiments, the antimony carbide may have a composition according to the following chemical formula (12) in which antimony in the chemical formula (11) is substituted with antimony and arsenic (As) or antimony and bismuth (Bi):

$$C_A [Sb_Y T_{(100-Y)}]_{(100-A)} \quad (12)$$

In the above chemical formula (12), T includes arsenic or bismuth and $0.1 \leq Y \leq 80.0$.

In some example embodiments, the tellurium carbide may have a composition in accordance with the following chemical formula (13):

$$C_A Te_{(100-A)} \tag{13}$$

In the above chemical formula (13), C indicates carbon and $4.0 \leq A \leq 20.0$.

In some example embodiments, the tellurium carbide may have a composition according to the following chemical formula (14) in which tellurium in the chemical formula (13) is substituted with antimony and selenium (Se):

$$C_A Q_{(100-A)} \tag{14}$$

In the above chemical formula (14), Q indicates antimony and selenium.

In some example embodiments, a fourth powder including metal carbide may be additionally formed. The metal carbide may have a composition in accordance with the following chemical formula (15):

$$C_A M_{(100-A)} \tag{15}$$

In the above chemical formula (15), M indicates metal. Examples of the metal carbide may include aluminum carbide, gallium carbide, indium carbide, titanium carbide, chrome carbide, manganese carbide, iron carbide, nickel carbide, cobalt carbide, zirconium carbide, molybdenum carbide, ruthenium carbide, palladium carbide, hafnium carbide, tantalum carbide, iridium carbide, platinum carbide, etc. These may be used alone or in a mixture thereof.

According to still another aspect of the present invention, there is provided a method of manufacturing a phase-change memory device. In the method of manufacturing the phase-change memory device, a contact region is formed on a substrate. A lower electrode is formed on the substrate. The lower electrode is electrically connected to the contact region. A phase-change material layer is formed on the lower electrode using a chalcogenide compound target including carbon and metal, or carbon, nitrogen and metal. An upper electrode is formed on the phase-change material layer.

In some example embodiments, the phase-change material layer may include a chalcogenide compound in accordance with the following chemical formula (16):

$$C_A M_B [Ge_X Sb_Y Te_{(100-X-Y)}]_{(100-A-B)} \tag{16}$$

In the above chemical formula (16), C indicates carbon, M represents metal, $0.2 \leq A \leq 30.0$, $0.1 \leq B \leq 15.0$, $0.1 \leq X \leq 30.0$ and $0.1 \leq Y \leq 90.0$, and In some example embodiments, the phase-change material layer may include a chalcogenide compound in accordance with the following chemical formula (17):

$$C_A M_B N_C [Ge_X Sb_Y Te_{(100-X-Y)}]_{(100-A-B-C)} \tag{17}$$

In the above chemical formula (17), C means carbon, M denotes metal, N indicates nitrogen $0.2 \leq A \leq 30.0$, $0.1 \leq B \leq 15.0$, $0.1 \leq C \leq 10.0$, $0.1 \leq X \leq 30.0$ and $0.1 \leq Y \leq 90.0$.

According to still another aspect of the present invention, there is provided a method of manufacturing a phase-change memory device. In the method of manufacturing the phase-change memory device, a contact region is formed on a substrate, and then a lower electrode is formed on the substrate. The lower electrode is electrically connected to the contact region. A phase-change material layer is formed on the lower electrode by a sputtering process using a first target including carbon or metal carbide, and a second target including a chalcogenide compound. An upper electrode is formed on the phase-change material layer.

In some example embodiments, a first power may be applied to the first target, and a second power substantially different from the first power may be applied to the second target. For example, the first power may be in a range of about 100 W to about 2,000 W, and the second power may be in a range of about 20 W to about 500 W.

In some example embodiments, the metal carbide may have a composition in accordance with the following chemical formula (18):

$$C_A M_{(100-A)} \tag{18}$$

In the above chemical formula (18), M indicates metal, and $50.0 \leq A \leq 100.0$.

In some example embodiments, the phase-change material layer may include a chalcogenide compound in accordance with the following chemical formula (19):

$$C_A M_B [Ge_X Z_{(100-X)} Sb_Y Te_{(100-X-Y)}]_{(100-A-B)} \tag{19}$$

In the above chemical formula (19), Z includes silicon or tin. Further, $0.2 \leq A \leq 30.0$, $0.1 \leq B \leq 15.0$, $0.1 \leq X \leq 80.0$ and $0.1 \leq Y \leq 90.0$.

In some example embodiments, the phase-change material layer may include a chalcogenide compound in accordance with the following chemical formula (20):

$$C_A M_B [Ge_X Sb_Y T_{(100-Y)} Te_{(100-X-Y)}]_{(100-A-B)} \tag{20}$$

In the above chemical formula (20), T includes arsenic or bismuth. Additionally, $0.2 \leq A \leq 30.0$, $0.1 \leq B \leq 15.0$, $0.1 \leq X \leq 90.0$, and $0.1 \leq Y \leq 80.0$.

In some example embodiments, the phase-change material layer may include a chalcogenide compound in accordance with the following chemical formula (21):

$$C_A M_B [Ge_X Sb_Y Q_{(100-X-Y)}]_{(100-A-B)} \tag{21}$$

In the above chemical formula (21), Q includes antimony and selenium. Further, $0.2 \leq A \leq 30.0$, $0.1 \leq B \leq 15.0$, $0.1 \leq X \leq 90.0$ and $0.1 \leq Y \leq 90.0$.

In some example embodiments, the phase-change material layer may include a chalcogenide compound in accordance with the following chemical formula (22):

$$C_A M_B N_C [Ge_X Z_{(100-X)} Sb_Y Te_{(100-X-Y)}]_{(100-A-B-C)} \tag{22}$$

In the above chemical formula (22), Z includes silicon or tin, $0.1 \leq X \leq 80.0$ and $0.1 \leq Y \leq 90.0$. Additionally, $0.2 \leq A \leq 30.0$, $0.1 \leq B \leq 15.0$ and $0.1 \leq C \leq 10.0$.

In some example embodiments, the phase-change material layer may include a chalcogenide compound in accordance with the following chemical formula (23):

$$C_A M_B N_C [Ge_X Sb_Y T_{(100-Y)} Te_{(100-X-Y)}]_{(100-A-B-C)} \tag{23}$$

In the above chemical formula (22), T includes arsenic or bismuth, $0.1 \leq X \leq 90.0$ and $0.1 \leq Y \leq 80.0$. Further, $0.2 \leq A \leq 30.0$, $0.1 \leq B \leq 15.0$ and $0.1 \leq C \leq 10.0$.

According to the present invention, a chalcogenide compound target may include a chalcogenide compound that contains carbon and metal, or carbon, metal and nitrogen considering contents of carbon, metal and nitrogen. When a phase-change material layer is formed using the chalcogenide compound target by various sputtering processes, the phase transition of the phase-change material layer may be stably repeated and also the phase-change material layer may have enhanced crystallized temperature and resistance. Further, a phase-change memory device may have reduced set resistance and driving current while improving durability and sensing margin when the phase-change material layer is employed in the phase-change memory device.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF THE EMBODIMENTS

Figure 1:
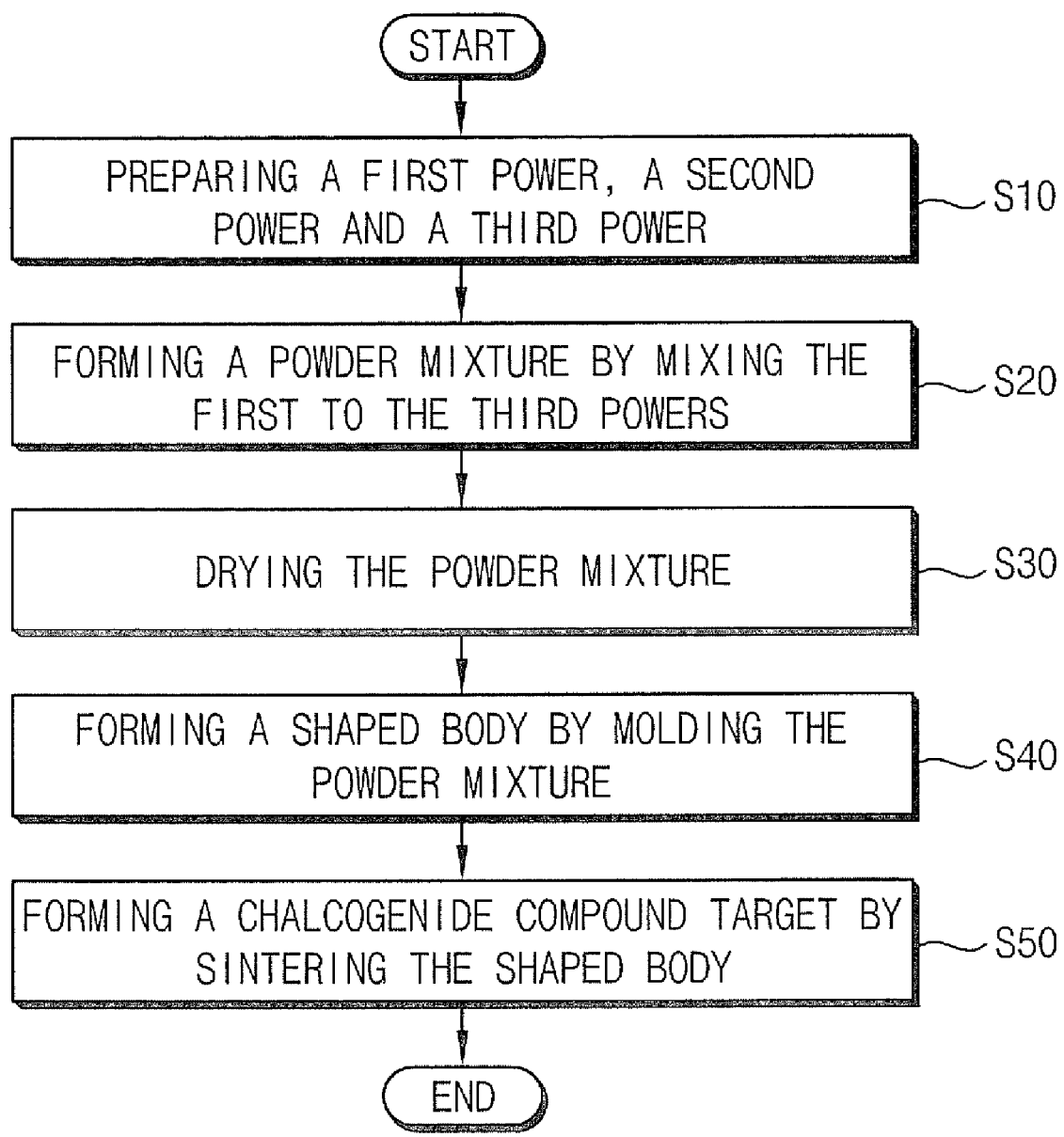
FIG. 1 is a flow chart illustrating a method of forming a chalcogenide compound target in accordance with example embodiments of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-sectional illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Chalcogenide Compound Target

A chalcogenide compound target according to example embodiments of the present invention may include carbon with a relative high content and metal with a relatively low content.

According to some example embodiments, the chalcogenide compound target may include a chalcogenide compound in accordance with the following chemical formula (1):

$$C_A M_B [Ge_X Sb_Y Te_{(100-X-Y)}]_{(100-A-B)} \qquad (1)$$

In the above chemical formula (1), C indicates carbon and M represents metal. Additionally, $8.0 \leq A \leq 40.0$ and $0.1 \leq B \leq 20.0$. Furthermore, $0.1 \leq X \leq 30.0$ and $0.1 \leq Y \leq 90.0$. Example of the metal in the chalcogenide compound may include aluminum (Al), gallium (Ga), indium (In), titanium (Ti), chrome (Cr), manganese (Mn), iron (Fe), cobalt (Co), nickel (Ni), zirconium (Zr), molybdenum (Mo), ruthenium (Ru), palladium (Pd), hafnium (Hf), tantalum (Ta), iridium (Ir), platinum (Pt), etc. These may be used alone or in a mixture thereof.

In an example embodiment, the chalcogenide compound target may include a chalcogenide compound in which germanium in the chemical formula (1) is substituted with germanium and silicon (Si) or germanium and tin (Sn). For example, the chalcogenide compound target may include a chalcogenide compound according to the following chemical formula (2):

$$C_A M_B [Ge_X Z_{(100-X)} Sb_Y Te_{(100-X-Y)}]_{(100-A-B)} \quad (2)$$

In the above chemical formula (2), Z includes silicon or tin. Further, $0.1 \leq X \leq 80.0$ and $0.1 \leq Y \leq 90.0$.

In an example embodiment, the chalcogenide compound target may include a chalcogenide compound in which antimony in the chemical formula (1) is substituted with antimony and arsenic (As) or antimony and bismuth (Bi). For example, the chalcogenide compound target may include a chalcogenide compound according to the following chemical formula (3):

$$C_A M_B [Ge_X Sb_Y T_{(100-Y)} Te_{(100-X-Y)}]_{(100-A-B)} \quad (3)$$

In the above chemical formula (3), T includes arsenic or bismuth. Additionally, $0.1 \leq X \leq 90.0$ and $0.1 \leq Y \leq 80.0$.

In an example embodiment, the chalcogenide compound target may include a chalcogenide compound in which tellurium in the chemical formula (1) is substituted with antimony and selenium (Se). For example, the chalcogenide compound target may include a chalcogenide compound according to the following chemical formula (4):

$$C_A M_B [Ge_X Sb_Y Q_{(100-X-Y)}]_{(100-A-B)} \quad (4)$$

In the above chemical formula (4), Q includes antimony and selenium (Se). Additionally, $0.1 \leq X \leq 30.0$ and $0.1 \leq Y \leq 90.0$.

According to other example embodiments of the present invention, the chalcogenide compound target may include carbon with a relatively content, metal with a relatively low content, and nitrogen with a relatively low content. For example, the chalcogenide compound target may include a chalcogenide compound in accordance with the following chemical formula (5):

$$C_A M_B N_C [Ge_X Sb_Y Te_{(100-X-Y)}]_{(100-A-B-C)} \quad (5)$$

In the above chemical formula (5), C means carbon, M denotes metal and N indicates nitrogen. Additionally, $8.0 \leq A \leq 30.0$, $0.1 \leq B \leq 15.0$ and $0.1 \leq C \leq 10.0$. Furthermore, $0.1 \leq X \leq 30.0$ and $0.1 \leq Y \leq 90.0$.

In an example embodiment, the chalcogenide compound target may include a chalcogenide compound in which germanium in the chemical formula (5) is substituted with germanium and silicon (Si) or germanium and tin (Sn). For example, the chalcogenide compound target may include a chalcogenide compound according to the following chemical formula (6):

$$C_A M_B N_C [Ge_X Z_{(100-X)} Sb_Y Te_{(100-X-Y)}]_{(100-A-B-C)} \quad (6)$$

In the above chemical formula (6), Z includes silicon or tin. Further, $0.1 \leq X \leq 80.0$ and $0.1 \leq Y \leq 90.0$.

In an example embodiment, the chalcogenide compound target may include a chalcogenide compound in which antimony in the chemical formula (5) is substituted with antimony and arsenic (As) or antimony and bismuth (Bi). For example, the chalcogenide compound target may include a chalcogenide compound according to the following chemical formula (7):

$$C_A M_B N_C [Ge_X Sb_Y T_{(100-Y)} Te_{(100-X-Y)}]_{(100-A-B-C)} \quad (7)$$

In the above chemical formula (7), T includes arsenic or bismuth. Additionally, $0.1 \leq X \leq 90.0$ and $0.1 \leq Y \leq 80.0$.

In an example embodiment, the chalcogenide compound target may include a chalcogenide compound in which tellurium in the chemical formula (5) is substituted with antimony and selenium (Se). For example, the chalcogenide compound target may include a chalcogenide compound according to the following chemical formula (8):

$$C_A M_B N_C [Ge_X Sb_Y Q_{(100-X-Y)}]_{(100-A-B)} \quad (8)$$

In the chemical formula (8), Q includes antimony and selenium (Se). Additionally, $0.1 \leq X \leq 30.0$ and $0.1 \leq Y \leq 90.0$.

In some example embodiments of the present invention, the chalcogenide compound target may include more than two of the chalcogenide compounds according to the chemical formulae (1) to (8).

Method of Forming a Chalcogenide Compound Target

FIG. 1 is a flow chart illustrating a method of forming a chalcogenide compound target in accordance with example embodiments of the present invention.

Referring to FIG. 1, a first compound powder, a second compound powder and a third compound powder are prepared in step S10. The first compound powder may include germanium carbide, and the second compound powder may include antimony. Additionally, the third compound powder may include tellurium.

In some example embodiments of the present invention, the first compound powder may have a composition according to the following chemical formula (9):

$$C_A Ge_{(100-A)} \quad (9)$$

In the above chemical formula (9), $8.0 \leq A \leq 50.0$.

In some example embodiments, a solution is prepared to form the first compound powder. The solution may include germanium alkoxide and carbon alkoxide. The solution may be dried at a temperature of about 50° C. to about 500° C. for about 1 hour to about 6 hours so that the first compound power is obtained. Here, a screening process may be additionally performed to advantageously adjust a particles size of the first compound powder. For example, the compound powder may have a desired particle size by a sieving process or a milling process. Further, the solution may be dried under a vacuum atmosphere or a reduction atmosphere.

In some example embodiments, the first compound powder may be obtained by calcinating a powder mixture after forming the powder mixture by mixing a germanium powder with a carbon powder such as a graphite powder while adding a solvent to the germanium powder and the carbon powder. For example, the powder mixture may be calcinated at a temperature of about 150° C. to about 2,000° C. under an inactive gas atmosphere or a reduction atmosphere. Further, the powder mixture may be grinded using a ball mill before calcinating the powder mixture.

In some example embodiments, the first compound powder may be prepared by calcinating a powder mixture after forming the powder mixture by drying a solution in which a germanium powder and a metal carbide powder are dissolved therein. Examples of the metal carbide may include aluminum carbide, gallium carbide, indium carbide, titanium carbide, chrome carbide, manganese carbide, iron carbide, cobalt carbide, nickel carbide, zirconium carbide, molybdenum carbide, ruthenium carbide, palladium carbide, hafnium carbide, tantalum carbide, iridium carbide, platinum carbide, etc. These may be used alone or in a mixture thereof.

In some example embodiments, the first compound powder may be obtained by mixing nano-carbon powder and germanium powder, or by a polymerization process.

Referring now to FIG. 1, the first compound powder, the second compound powder and the third compound powder are mixed by adding a solvent, thereby obtaining a powder mixture in step S20. For example, the solvent may include deionized water, alcohol, acetone, etc. In an example embodiment, the first compound powder, the second compound powder and the third compound powder may be mixed while grinding the first compound powder, the second compound powder and the third compound powder.

The powder mixture is inserted into a dryer in step S30, and then the dried powder mixture is molded to form a shaped body having a desired structure in step S40. For example, the powder mixture may be dried at a temperature of about 50° C. to about 500° C. for about 1 hour to about 6 hours. In the drying process, the solvent is removed from the powder mixture. In an example embodiment, the powder mixture may not be molded when the powder mixture is directly sintered.

In step S50, the shaped body or the powder mixture is sintered to form a chalcogenide compound target. The chalcogenide compound target may include a chalcogenide compound containing carbon. The chalcogenide compound target may be formed by a sintering process performed at a temperature of about 150° C. to about 2,000° C. under an inactive gas atmosphere or a reduction atmosphere. For example, the sintering process may include a furnace sintering process, a hot pressing process, a hot isostatic process, a reactive hot pressing process, etc.

In some example embodiments, the chalcogenide compound target may be obtained using a first compound powder having a composition in which germanium in the above chemical formula (9) is substituted with germanium and silicon or germanium and tin. For example, the chalcogenide compound target may be obtained using a first compound powder having a composition according to the following chemical formula (10):

$$C_A[Ge_XZ_{(100-X)}]_{(100-A)} \quad (10)$$

In the above chemical formula (10), Z includes silicon or tin, and $0.1 \leq X \leq 80.0$.

In some example embodiments, the chalcogenide compound target may be formed using a chalcogenide compound obtained from a first powder including germanium, a second compound powder including antimony carbide, and a third powder including tellurium. The second compound powder may have a composition in accordance with the following chemical formula (11):

$$C_ASb_{(100-A)} \quad (11)$$

In the above chemical formula (11), $8.0 \leq A \leq 50.0$.

In some example embodiments, the chalcogenide compound target may be obtained using a second compound powder having a composition in which antimony in the above chemical formula (11) is substituted with antimony and arsenic, or antimony and bismuth. For example, the chalcogenide compound target may be obtained using a second compound powder having a composition according to the following chemical formula (12):

$$C_A[Sb_YT_{(100-X)}]_{(100-A)} \quad (12)$$

In the above chemical formula (12), T includes arsenic or bismuth, and $0.1 \leq Y \leq 80.0$.

In some example embodiments, the chalcogenide compound target may be formed using a chalcogenide compound obtained from a first powder including germanium, a second powder including antimony, and a third compound powder including tellurium carbide. The third compound powder may have a composition in accordance with the following chemical formula (13):

$$C_ATe_{(100-A)} \quad (13)$$

In the above chemical formula (13), $8.0 \leq A \leq 50.0$.

In some example embodiments, the chalcogenide compound target may be obtained using a third compound powder having a composition in which tellurium in the above chemical formula (13) is substituted with antimony and selenium. For example, the chalcogenide compound target may be obtained using a second compound powder having a composition according to the following chemical formula (14):

$$C_AQ_{(100-A)} \quad (14)$$

In the above chemical formula (14), Q includes antimony and selenium, and $8.0 \leq A \leq 50.0$.

In some example embodiments, the chalcogenide compound target may be formed using a chalcogenide compound obtained from a first powder including germanium, a second powder including antimony, a third powder including tellurium, and a fourth powder including metal carbide. The fourth powder may have a composition in accordance with the following chemical formula (15):

$$C_AM_{(100-A)} \quad (15)$$

In the above chemical formula (15), M indicates metal and $50.0 \leq A \leq 100.0$. Examples of metal in the fourth powder may include aluminum, gallium, indium, titanium, chrome, manganese, iron, nickel, cobalt, zirconium, molybdenum, ruthenium, palladium, hafnium, tantalum, iridium, platinum, etc. These may be used alone or in a mixture thereof.

In some example embodiments, the chalcogenide compound target may be formed using a chalcogenide compound including carbon and metal, which is obtained using a powder including antimony, a powder including tellurium, a powder including germanium-silicon, and a metal carbide powder having a composition in the above chemical formula (15).

In some example embodiments, the chalcogenide compound target may be formed using a chalcogenide compound including carbon and metal, which is obtained using a powder including germanium, a powder including tellurium, a powder including antimony-arsenic or antimony-bismuth, and a metal carbide powder having a composition in the above chemical formula (15).

In some example embodiments, the chalcogenide compound target may be formed using a chalcogenide compound including carbon and metal, which is obtained using a powder including germanium, a powder including antimony, a powder including antimony and selenium, and a metal carbide powder having a composition in the above chemical formula (15).

Method of Manufacturing a Phase-change Memory Device

FIGS. 2A to 2K are cross-sectional views illustrating a method of manufacturing a phase-change memory device in accordance with example embodiments of the present invention.

Figure 2A:
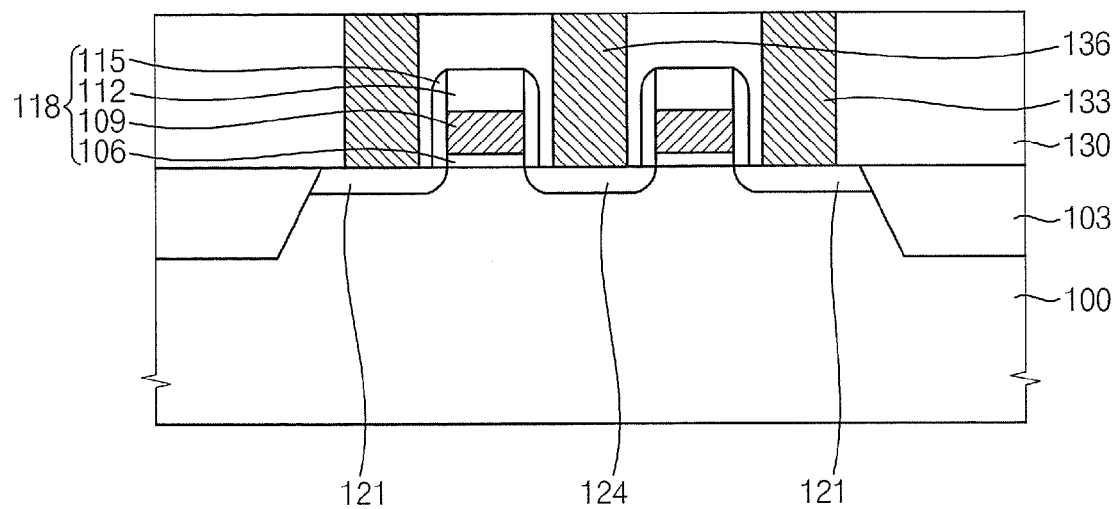
FIGS. 2A to 2E are cross-sectional views illustrating a method of manufacturing a phase-change memory device in accordance with example embodiments of the present invention.

Referring to FIG. 2A, an isolation layer 103 is formed on a substrate 100 to define an active region and a field region. For example, the field region may correspond to one portion of the substrate 100 on which the isolation layer 103 is positioned, whereas the active region may correspond to another portion of the substrate 100 enclosed by the isolation layer 103.

The substrate 100 may include a single crystalline metal oxide substrate or a semiconductor substrate such as a silicon substrate, a germanium substrate, a silicon on insulator (SOI) substrate, a germanium on insulator (GOI) substrate, etc.

The isolation layer 103 may be formed by an isolation process such as a shallow trench isolation (STI) process or a thermal oxidation process. The isolation layer 103 may be formed using an oxide such as silicon oxide.

A gate insulation layer (now illustrated), a gate conductive layer (not illustrated) and a gate mask layer (not illustrated) are successively formed on the substrate 100.

In one example embodiment, the gate mask layer, the gate conductive layer and the gate insulation layer are patterned by a photolithography process, thereby forming a gate insulation layer pattern 106, a gate electrode 109 and a gate mask 112 on the active region of the substrate 100. In another example embodiment, the gate mask layer may be etched to form the gate mask 112 on the gate conductive layer, and then the gate conductive layer and the gate insulation layer may be patterned using the gate mask 112 so as to form the gate insulation layer pattern 106 and the gate electrode 109.

The gate insulation layer pattern 106 may include an oxide or a metal oxide. For example, the gate insulation layer pattern 106 may include silicon oxide, aluminum oxide, zirconium oxide, hafnium oxide, tantalum oxide, etc.

The gate electrode 109 may include polysilicon doped with impurities, a metal or a metal compound. For example, the gate electrode 109 may include tungsten, aluminum, copper, titanium, tantalum, tungsten nitride, aluminum nitride, titanium nitride, tantalum nitride, titanium aluminum nitride, etc. These may be used alone or in a mixture thereof.

The gate mask 112r may include a material having an etching selectivity relative to the gate insulation layer pattern 106 and the gate electrode 109. For example, the gate mask 112 may include silicon nitride or silicon oxynitride.

After a lower insulation layer (not illustrated) is formed on the substrate 100 to cover the gate mask pattern 112, lower insulation layer is etched to form a gate spacer 115 on sidewalls of the gate insulation layer pattern 106, the gate electrode 109 and the gate mask 112. For example, the gate spacer 115 may be formed using a nitride such as silicon nitride. As a result, a gate structure 118 including the gate insulation layer pattern 106, the gate electrode 109, the gate mask 112 and the gate spacer 115 is provided on the active region of the substrate 100.

Impurities are implanted into portions of the substrate 100 adjacent to the gate structure 118 such that a first contact region 121 and a second contact region 124 are formed at the portions of the substrate 100. The first and the second contact regions 121 and 124 may be formed by an ion implantation process. A lower electrode 160 (see FIG. 2D) may be electrically connected to the first contact region 121, and a lower wiring 142 (see FIG. 2B) may be electrically connected to the second contact region 124.

A lower insulating interlayer 130 is formed on the substrate 100 to cover the gate structure 118. The lower insulating interlayer 130 may be formed by a chemical vapor deposition (CVD) process, a plasma enhanced chemical vapor deposition (PECVD) process, a low pressure chemical vapor deposition (LPCVD) process, a high density plasma-chemical vapor deposition (HDP-CVD) process, etc. Further, the lower insulating interlayer 130 may be formed using an oxide such as silicon oxide. For example, the lower insulating interlayer 130 may be formed using phosphor silicate glass (PSG), boro-phosphor silicate glass (BPSG), undoped silicate glass (USG), spin on glass (SOG), tetraethylortho silicate (TEOS), plasma enhanced tetraethylortho silicate (PE-TEOS), flowable oxide (FOX), HDP-CVD oxide, etc. In an example embodiment, the lower insulating interlayer 130 may be planarized by a planarization process. For example, the lower insulating interlayer 130 may have a level surface by a chemical mechanical polishing (CMP) process and/or an etch-back process.

The lower insulating interlayer 130 is partially etched by a photolithography process so that a first contact hole (not illustrated) and a second contact hole (not illustrated) are formed through the lower insulating interlayer 130. The first and the second contact holes expose the first and the second contact regions 121 and 124, respectively.

A first lower conductive layer (not illustrated) is formed on the lower insulating interlayer 130 to fill up the first and the second contact holes. The first lower conductive layer may be formed using a metal, a metal compound or doped polysilicon. For example, the first lower electrode layer may be formed using tungsten, aluminum, copper, titanium, tantalum, tungsten nitride, aluminum nitride, titanium nitride, tantalum nitride, titanium aluminum nitride, etc. These may be used alone or in a mixture thereof. The first lower electrode layer may be formed by a sputtering process, a CVD process, an LPCVD process, an atomic layer deposition (ALD) process, an electron beam evaporation process, a pulsed-laser deposition (PLD) process, etc.

The first lower conductive layer is partially removed until the lower insulating interlayer 130 is exposed. Accordingly, a first pad 133 and a second pad 136 are formed through the lower insulating interlayer 130. The first pad 133 filling the first contact hole is formed on the first contact region 121, and the second pad 136 filling the second contact hole is positioned on the second contact region 124.

Figure 2B:
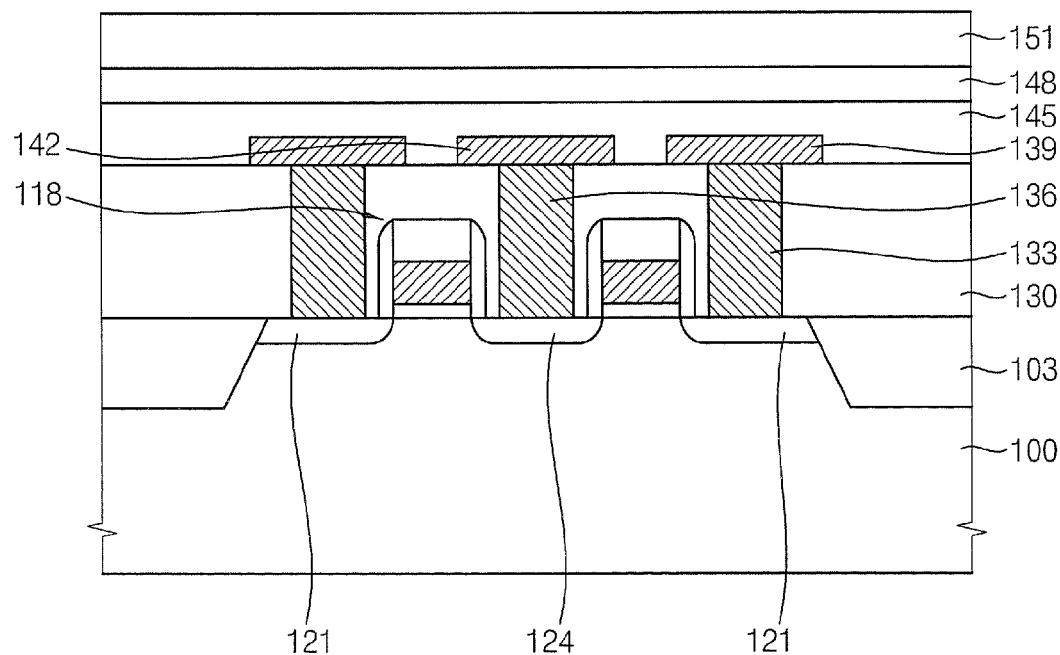
Figure 2C:
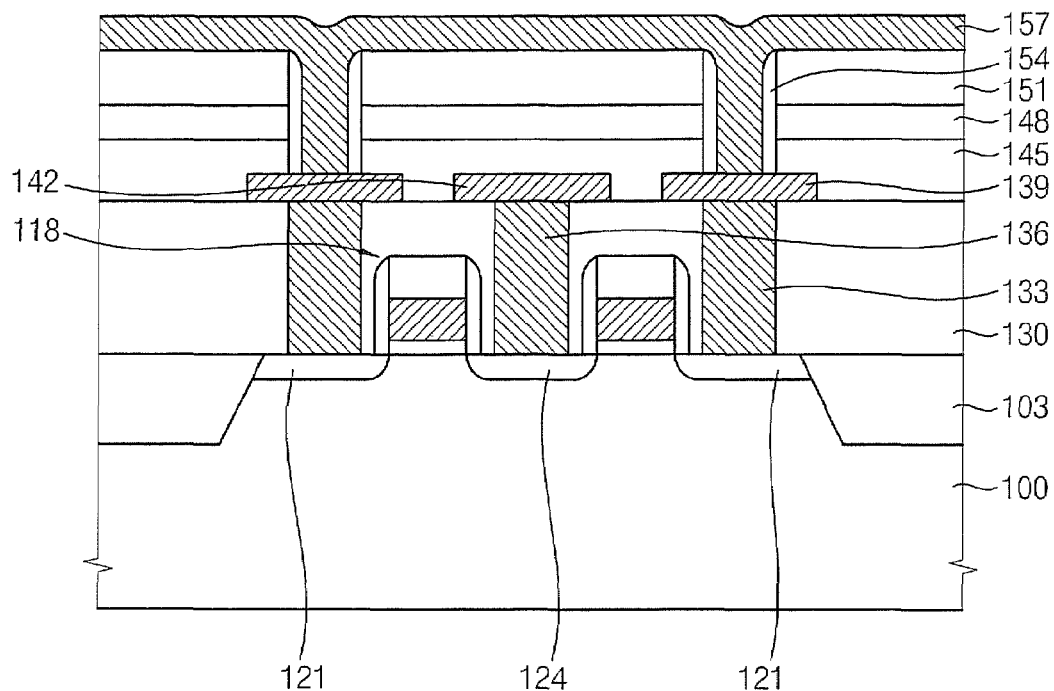

Referring to FIG. 2B, a second lower conductive layer (not illustrated) is formed on the lower insulating interlayer 130, the first pad 133 and the second pad 136. The second lower conductive layer may be formed using a metal, a metal compound or doped polysilicon. For example, the second lower electrode layer may be formed using tungsten, aluminum, copper, titanium, tantalum, tungsten nitride, aluminum nitride, titanium nitride, tantalum nitride, titanium aluminum nitride, etc. These may be used alone or in a mixture thereof. Further, the second lower electrode layer may be formed by a sputtering process, a CVD process, an LPCVD process, an ALD process, an electron beam evaporation process, a PLD process, etc.

The second lower conductive layer is patterned by a photolithography process to form a third pad 139 and the lower wiring 142. Since third pad 139 is formed on the first pad 133, the third pad 139 may be electrically connected to the first contact region 121 through the first pad 133. The lower wiring 142 locates on the second pad 136 so that the lower wiring 142 may make electrically contact with the second contact region 133. In some example embodiments, the lower wiring 142 may include a bit line. The third pad 139 and the lower wiring 142 may have widths substantially wider than those of the first and the second pads 133 and 136, respectively.

A first insulation layer 145 is formed on the lower insulating interlayer 130 to cover the third pad 139 and the lower wiring 142. The first insulation layer 145 may be formed using an oxide. For example, the first insulation layer 145 may be formed using silicon oxide such as PSG, BPSG, USG, SOG, TEOS, PE-TEOS, FOX, HDP-CVD oxide, etc. Further, the first insulation layer 145 may be formed by a CVD process, a PECVD process, an LPCVD process, an HDP-CVD process, etc. In an example embodiment, an upper portion of the first insulation layer 145 may be planarized by a CMP process and/or an etch-back process.

In some example embodiments of the present invention, the first insulation layer 145 may be formed using an oxide substantially the same as that of the lower insulating interlayer 130. Alternatively, the first insulation layer 145 and the lower insulating interlayer 130 may be formed using different oxides, respectively.

A second insulation layer 148 and a sacrificial layer 151 are sequentially formed on the first insulation layer 145. The sacrificial layer 151 may be formed using an oxide substantially the same as or substantially similar to that of the first insulation layer 145. The second insulation layer 148 may be formed using a material having an etching selectivity relative to the first insulation layer 145 and the sacrificial layer 151. For example, the sacrificial layer 151 may be formed using PSG, BPSG, USG, SOG, TEOS, PE-TEOS, FOX, HDP-CVD oxide, etc. The second insulation layer 148 may be formed using a nitride such as silicon nitride or silicon oxynitride. Further, the sacrificial layer 151 may be formed by a CVD process, a PECVD process, an LPCVD process, an HDP-CVD process, etc. The second insulation layer 148 may be formed by a CVD process, a PECVD process, an LPCVD process, etc.

The first and the second insulation layers 145 and 148 may serve together as a mold structure for forming the lower electrode 160. Additionally, the first and the second insulation layers 145 and 148 may protect underlying structures formed on the substrate 100 in successive processes for forming the lower electrode 160. The sacrificial layer 151 may also serve as the mold structure for forming the lower electrode 160. The sacrificial layer 151 is removed from the second insulation layer 148 after forming the lower electrode 160. In some example embodiments, each of the first insulation layer 145 and the sacrificial layer 151 may be substantially thicker than the second insulation layer 148.

After a photoresist pattern (not illustrated) is formed on the sacrificial layer 151, the sacrificial layer 151, the second insulation layer 148 and the first insulation layer 145 are partially etched using the photoresist pattern as an etching mask. Hence, an opening (not illustrated) is formed through the first insulation layer 145, the second insulation layer 148 and the sacrificial layer 151. The opening exposes the third pad 139. After forming the opening, the photoresist pattern may be removed from the sacrificial layer 151 by an ashing process and/or a stripping process.

An upper insulation layer (not illustrated) is formed on the third pad 139, a sidewall of the opening and the sacrificial layer 151, and then the upper insulation layer is partially etched to form a preliminary spacer 154 on the sidewall of the opening. The upper insulation layer may be formed using a nitride such as silicon nitride. The preliminary spacer 154 may be formed by an anisotropic etching process. The preliminary spacer 154 may reduce a width of the opening to thereby adjust a critical dimension of the lower electrode 160 formed in the opening. When the preliminary spacer 154 is formed on the sidewall of the opening, the third pad 139 is exposed through the opening.

A lower electrode layer 157 is formed on the exposed third pad 139 and the sacrificial layer 151 to fill up the opening. The lower electrode layer 157 may be formed using a metal and/or a metal compound. For example, the lower electrode layer 157 may be formed using iridium, ruthenium, platinum, palladium, tungsten, titanium, tantalum, aluminum, titanium nitride, tantalum nitride, molybdenum nitride, niobium nitride, titanium silicon nitride, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride, etc. These may be used alone or in a mixture thereof. Additionally, the lower electrode layer 157 may be formed by a sputtering process, a CVD process, a PECVD process, an electron beam evaporation process, an ALD process, a PLD process, etc.

Figure 2D:
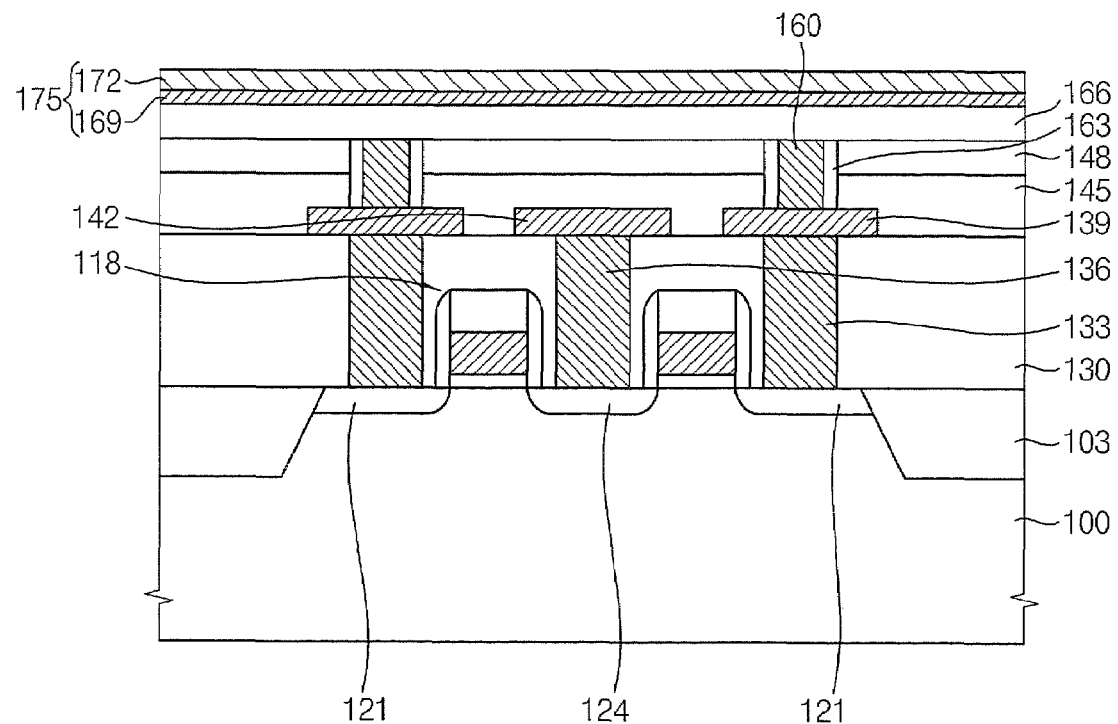

Referring to FIG. 2D, the lower electrode layer 157 is partially removed until the sacrificial layer 151 is exposed. Thus, a preliminary lower electrode (not illustrated) is formed to fully fill up the opening. The preliminary spacer 154 is positioned between the sidewall of the opening and the preliminary lower electrode. The preliminary lower electrode may be formed by a CMP process and/or an etch-back process.

After a formation of the preliminary lower electrode, the sacrificial layer 151 is removed from the second insulation layer 148. The sacrificial layer 151 may be removed by a wet etching process using an etching solution including fluoride. Alternatively, the sacrificial layer 151 may be removed by a dry etching process using an etching gas containing fluoride. In the etching process for removing the sacrificial layer 151, the second insulation layer 148 may effectively protect the underlying structures formed on the substrate 100. When the sacrificial layer 151 is removed, the preliminary lower electrode and the preliminary spacer 154 are upwardly protruded from the second insulation layer 148. For example, upper portions of the preliminary lower electrode and the preliminary spacer 145 may be protruded as pillar shapes.

The protruded portions of the preliminary lower electrode and the preliminary spacer 154 are removed to form the lower electrode 160 and a spacer 163 on the third pad 136. The spacer 163 and the lower electrode 160 may be formed by a CMP process and/or an etch-back process. The second insulation layer 148 may serve as an etching stop layer while forming the lower electrode 160 and the spacer 163. The lower electrode 160 may electrically make contact with the first contact region 121 through the first pad 133 and the third pad 139. The spacer 163 may adjust the width of the lower electrode 160. In an example embodiment, the processes for forming the spacer 163 may be omitted when the opening has a desired width for the lower electrode 160.

A phase-change material layer 166 is formed on the lower electrode 160, the spacer 163 and the second insulation layer 148. The phase-change material layer 166 may be formed using a chalcogenide compound by a PVD process or a CVD process.

In some example embodiments, the phase-change material layer 166 may be formed by a sputtering process using one target. That is, the phase-change material layer 166 may be formed using a chalcogenide compound target including a chalcogenide compound that contains carbon and metal, or carbon, nitrogen and metal. For example, the phase-change material layer 166 may be formed using a chalcogenide compound target including at least one chalcogenide compound according to the above chemical formulae (1) to (8). Alternatively, the phase-change material layer 166 may be formed on the lower electrode 160 and the second insulation layer 148 using a chalcogenide compound target under a nitrogen atmosphere.

When the phase-change material layer 166 is formed using chalcogenide compound target including at least one chalcogenide compound according to the above chemical formulae (1) to (4), the phase-change material layer 166 may include a chalcogenide compound according to the following chemical formulae (16) to (19) as the composition of the chalcogenide compound target.

$$C_A M_B [Ge_X Sb_Y Te_{(100-X-Y)}]_{(100-A-B)} \qquad (16)$$

In the above chemical formula (16), C indicates carbon and M denotes metal. Examples of metal in the phase-change material layer 166 may include aluminum, gallium, indium, titanium, chrome, manganese, iron, cobalt, nickel, zirconium, molybdenum, ruthenium, palladium, hafnium, tantalum, iridium, platinum, etc. These may be used alone or in a mixture thereof. Additionally, $0.2 \leq A \leq 30.0$, $0.1 \leq B \leq 50.0$, $0.1 \leq X \leq 30.0$ and $0.1 \leq Y \leq 90.0$.

$$C_A M_B [Ge_X Z_{(100-X)} Sb_Y Te_{(100-X-Y)}]_{(100-A-B)} \quad (17)$$

In the above chemical formula (17), Z includes silicon or tin. Further, $0.2 \leq A \leq 30.0$, $0.1 \leq B \leq 15.0$, $0.1 \leq X \leq 80.0$ and $0.1 \leq Y \leq 90.0$.

$$C_A M_B [Ge_X Sb_Y T_{(100-Y)} Te_{(100-X-Y)}]_{(100-A-B)} \quad (18)$$

In the above chemical formula (18), T includes arsenic or bismuth. Additionally, $0.2 \leq A \leq 30.0$, $0.1 \leq B \leq 15.0$, $0.1 \leq X \leq 90.0$, and $0.1 \leq Y \leq 80.0$.

$$C_A M_B [Ge_X Sb_Y Q_{(100-X-Y)}]_{(100-A-B)} \quad (19)$$

In the above chemical formula (19), Q includes antimony and selenium. Further, $0.2 \leq A \leq 30.0$, $0.1 \leq B \leq 15.0$, $0.1 \leq X \leq 90.0$ and $0.1 \leq Y \leq 90.0$.

When the phase-change material layer 166 is formed using chalcogenide compound target including at least one chalcogenide compound according to the above chemical formulae (5) to (8), the phase-change material layer 166 may include a chalcogenide compound according to the following chemical formulae (20) to (23) as the composition of the chalcogenide compound target.

$$C_A M_B N_C [Ge_X Sb_Y Te_{(100-X-Y)}]_{(100-A-B-C)} \quad (20)$$

In the chemical formula (20), C means carbon, M indicates metal and N denotes nitrogen. Further, $0.2 \leq A \leq 30.0$, $0.1 \leq B \leq 15.0$, $0.1 \leq C \leq 10.0$, $0.1 \leq X \leq 30.0$ and $0.1 \leq Y \leq 90.0$.

$$C_A M_B N_C [Ge_X Z_{(100-X)} Sb_Y Te_{(100-X-Y)}]_{(100-A-B-C)} \quad (21)$$

In the above chemical formula (21), Z includes silicon or tin, $0.1 \leq X \leq 80.0$ and $0.1 \leq Y \leq 90.0$. Additionally, $0.2 \leq A \leq 30.0$, $0.1 \leq B \leq 15.0$ and $0.1 \leq C \leq 10.0$.

$$C_A M_B N_C [Ge_X Sb_Y T_{(100-Y)} Te_{(100-X-Y)}]_{(100-A-B-C)} \quad (22)$$

In the above chemical formula (22), T includes arsenic or bismuth, $0.1 \leq X \leq 90.0$ and $0.1 \leq Y \leq 80.0$. Further, $0.2 \leq A \leq 30.0$, $0.1 \leq B \leq 15.0$ and $0.1 \leq C \leq 10.0$.

$$C_A M_B N_C [Ge_X Sb_Y Q_{(100-X-Y)}]_{(100-A-B)} \quad (23)$$

In the above chemical formula (23), Q includes antimony and selenium. Further, $0.2 \leq A \leq 30.0$, $0.1 \leq B \leq 15.0$, $0.1 \leq C \leq 10.0$, $0.1 \leq X \leq 90.0$ and $0.1 \leq Y \leq 90.0$.

In some example embodiments of the present invention, the phase-change material layer 166 may be formed on the lower electrode 160 and the second insulation layer 148 by a co-sputtering process using more than two targets. For example, the phase-change material layer 166 simultaneously using a first target including carbon or metal carbide, and a second target including a chalcogenide compound. Alternatively, the phase-change material layer 166 may be formed simultaneously using a first target including carbon or metal carbide, a second target including a chalcogenide compound under a nitrogen atmosphere.

In the sputtering process, a reaction chamber may have a pressure of about 0.1 mTorr to about 100 mTorr and a temperature of about 30° to about 400° C. Additionally, substantially different powers may be applied to the first and the second target, respectively in the sputtering process. For example, a first power of about 100 W to about 200 W may be applied to the first target, and a second power of about 20 W to about 500 W may be applied to the second target.

When the phase-change material layer 166 is formed using the first target including carbon or metal carbide, and the second target including a chalcogenide compound, the sputtering yield of carbon may be considerably different from the sputtering yield of the chalcogenide compound in the sputtering process. For example, the sputtering yield of the chalcogenide compound may be larger than that of carbon by about 20 times to about 40 times. Therefore, the first target may have high carbon content to obtain the phase-change material layer 166 having desired carbon content. Alternatively, a chalcogenide compound target may have carbon content considerably higher than that of chalcogenide compound when the chalcogenide compound target simultaneously includes carbon and chalcogenide compound.

In some example embodiments, the substrate 100 may be revolved while performing the sputtering process using the first and the second targets in order to form the phase-change material layer 166 having uniform composition and thickness.

When the phase-change material layer 166 is formed by simultaneously using more than two targets, the phase-change material layer 166 may not be damaged by particles physically deposited thereon because the target including the chalcogenide compound has clean surface and the target including carbon also has pure surface. Although the sputtering yield of carbon is different from that of chalcogenide compound, the sputtering rates of carbon and chalcogenide compound may be controlled by applying different powers to the targets, respectively. As a result, the phase-change material layer 166 may have more uniform composition and thickness. Further, the phase-change material layer 166 may have various compositions because several targets having various compositions may be used to form the phase-change material layer 166.

In some example embodiments, the phase-change material layer 166 may be formed on the lower electrode 160 and the second insulation layer 148 by a sputtering process simultaneously using a first target including carbon or metal carbide, a second target including germanium-tellurium and a third target including antimony-tellurium. Alternatively, the phase-change material layer 166 may be formed simultaneously using a first target including carbon, a second target including metal and a third target including a chalcogenide compound. Furthermore, the phase-change material layer 166 may be formed simultaneously using a first target including carbon, a second target including metal and a third target including a chalcogenide compound under a nitrogen atmosphere.

According to some example embodiments of the present invention, the phase-change material layer 166 is formed using a chalcogenide compound doped with carbon and metal, or carbon, nitrogen and metal. Thus, the phase-change material layer 166 may have improved crystallized temperature and resistance considerably larger than those of the conventional phase-change material layer including a GST compound, or a GST compound doped with nitrogen.

Referring now to FIG. 2D, a second upper electrode film 169 and a second upper electrode film 172 are sequentially formed on the phase-change material layer 166 including the above-described composition. Thus, an upper electrode layer 175 including the first and the second upper electrode films 169 and 172 is provided on the phase-change material layer 166.

The first upper electrode film 169 may be formed using a metal, and the second upper electrode film 172 may be formed using a metal compound. For example, the first upper electrode film 169 may be formed using aluminum, gallium, indium, titanium, chrome, manganese, iron, cobalt, nickel, zirconium, molybdenum, ruthenium, palladium, hafnium, tantalum, iridium, platinum, etc. These may be used alone or in a mixture thereof. Further, the second upper electrode film 172 may be formed using aluminum nitride, gallium nitride, indium nitride, titanium nitride, chrome nitride, manganese nitride, iron nitride, cobalt nitride, nickel nitride, zirconium nitride, molybdenum nitride, ruthenium nitride, palladium nitride, hafnium nitride, tantalum nitride, iridium nitride, platinum nitride, tungsten nitride, niobium nitride, titanium silicon nitride, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride, etc. These may be used alone or in a mixture thereof. The first and the second upper electrode films 169 and 172 may be formed by a sputtering process, a CVD process, a PECVD process, an electron beam evaporation process, an ALD process, a PLD process, etc.

Figure 2E:
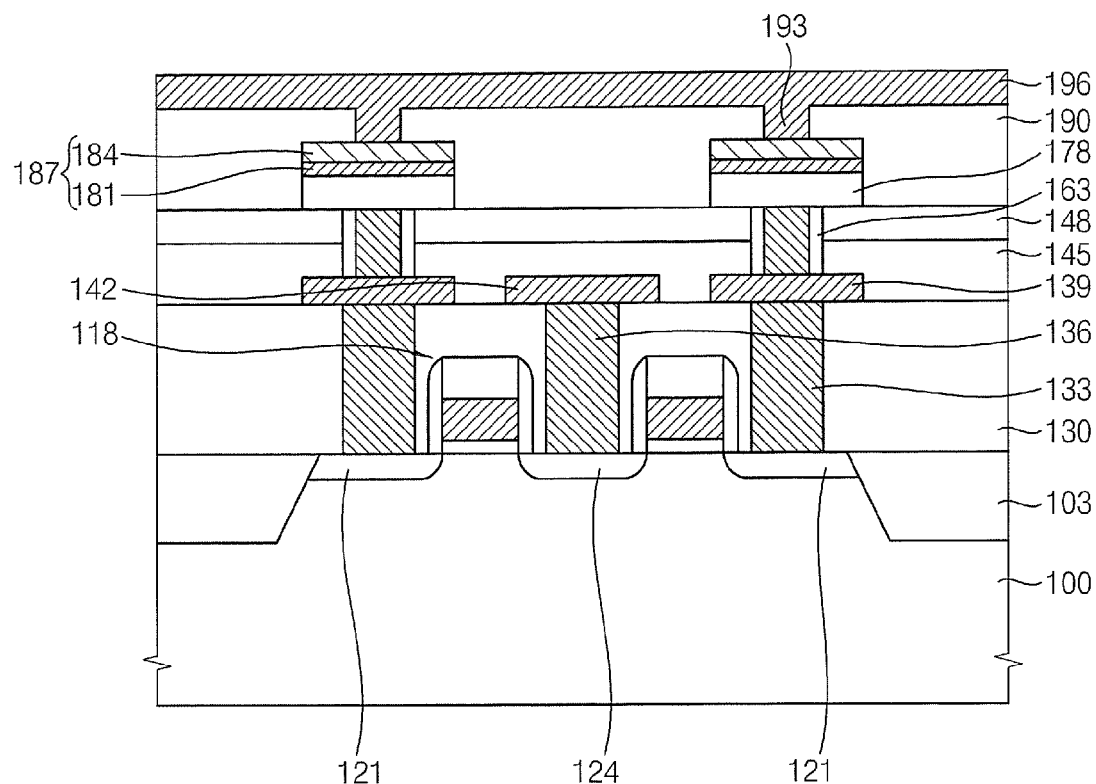

Referring to FIG. 2E, a photoresist pattern (not illustrated) is formed on the second upper electrode film 172, and then the second upper electrode film 172, the first upper electrode film 169 and the phase-change material layer 166 are patterned, thereby forming a phase-change material layer pattern 178 and an upper electrode 187 on the lower electrode 160 and the second insulation layer 148. The upper electrode 187 includes a first upper electrode film pattern 181 and a second upper electrode film pattern 184.

In some example embodiments, the phase-change material layer pattern 178 and the upper electrode 187 may have widths substantially wider than that of the lower electrode 160.

An upper insulating interlayer 190 is formed on the second insulation layer 148 to cover the upper electrode 187. The upper insulating interlayer 190 may be formed by a CVD process, a PECVD process, an LPCVD process, an HDP-CVD process, etc. Further, the upper insulating interlayer 190 may be formed using an oxide such as PSG, BPSG, USG, SOG, TEOS, PE-TEOS, FOX, HAD-CVD, etc.

In one example embodiment, the upper insulating layer 190 may be formed using an oxide substantially the same as that of the lower insulating interlayer 130, the sacrificial layer 151 and/or the first insulating layer 145. In another example embodiment, the upper insulating layer 190, the lower insulating interlayer 130, the sacrificial layer 151 and/or the first insulating layer 145 may be formed using difference oxides, respectively.

The upper insulating interlayer 190 is partially etched by a photolithography process to form an upper contact hole (not illustrated). The upper contact hole exposes the second upper electrode film pattern 184 of the upper electrode 187.

An upper pad 193 and an upper wiring 196 are formed on the upper electrode 187 and the upper insulating interlayer 190. The upper pad 193 filling the upper contact hole is positioned on the exposed upper electrode 187. The upper wiring 196 is formed on the upper pad 193 and the upper insulating layer 190. The upper pad 193 and the upper wiring 196 may be formed using doped polysilicon, a metal and/or a metal compound. For example, the upper pad 193 and the upper wiring 196 may be formed using tungsten, titanium, tantalum, aluminum, tungsten nitride, aluminum nitride, titanium nitride, tantalum nitride, molybdenum nitride, niobium nitride, titanium aluminum nitride, etc. These may be used alone or in a mixture thereof. Further, the upper pad 193 and the upper wiring 196 may be formed by a sputtering process, a CVD process, an ALD process, an electron beam evaporation process, a PLD process, etc. In one example embodiment, the upper wiring 196 and the upper pad 193 may be integrally formed each other. In another example embodiment, the upper pad 193 is formed on the upper electrode 187, and then the upper wiring 196 is formed on the upper pad 193 and the upper insulating interlayer 190.

FIGS. 3A to 3D are cross-sectional views illustrating a method of manufacturing a phase-change memory device in accordance with example embodiments of the present invention. In FIGS. 3A to 3D, processes for forming an isolation layer 203, a gate structure 218, a first contact region 221, a second contact region 224, a lower insulating interlayer 230 on a substrate 200 may be substantially the same as the processes described with reference to FIG. 2A.

The gate structure 218 is positioned on an active region of the substrate 200. The gate structure 218 includes a gate insulation layer pattern 206, a gate electrode 209, a gate mask 212 and a gate spacer 215.

Figure 3A:
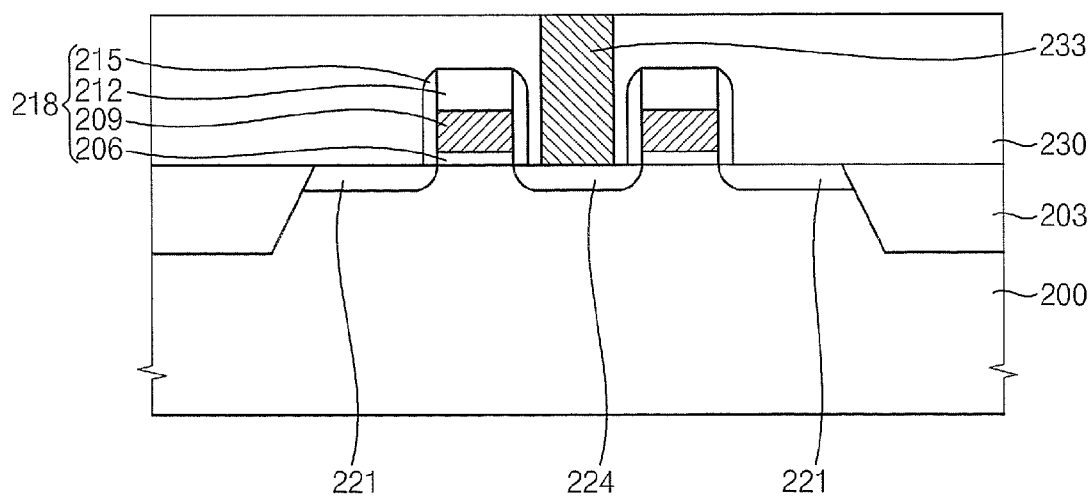
FIGS. 3A to 3D are cross-sectional views illustrating a method of manufacturing a phase-change memory device in accordance with example embodiments of the present invention.

Referring to FIG. 3A, a first photoresist pattern (not illustrated) is formed on the lower insulating interlayer 230, and then the lower insulating interlayer 230 is partially etched using the first photoresist pattern as an etching mask. Thus, a lower contact hole (not illustrated) is formed through the lower insulating interlayer 230. The lower contact hole exposes the second contact region 224. Here, the first contact region 221 is not exposed.

A first lower conductive layer (not illustrated) is formed on the lower insulating interlayer 230 to fill up the lower contact hole. The first lower conductive layer may be formed using metal, metal compound or doped polysilicon.

The first lower conductive layer is partially removed until the lower insulating interlayer 230 is exposed so that a lower pad 233 filling the lower contact hole is formed on the second contact region 224. The lower pad 233 may electrically connect a lower wiring 236 (see FIG. 3B) to the second contact region 224.

Figure 3B:
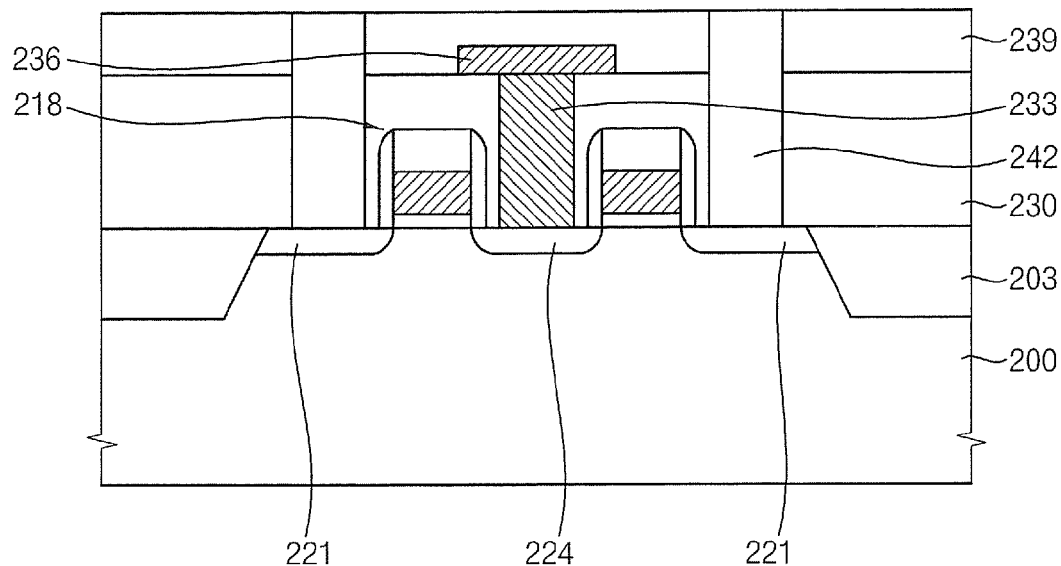

Referring to FIG. 3B, a second lower conductive layer (not illustrated) is formed on the lower pad 233 and the lower insulating interlayer 230. The second lower conductive layer 233 is patterned by a photolithography process to form the lower wiring 236 on the lower pad 233. For example, the lower wiring 236 may include a bit line.

In an example embodiment, the lower pad 233 and the lower wiring 236 may be integrally formed each other. For example, a lower conductive layer (not illustrated) may be formed on the lower insulating interlayer 230 to fill up the lower contact hole, and then the lower conductive layer may be patterned to simultaneously form the lower wiring 236 and the lower pad 233.

An insulation structure 239 is formed on the lower insulating interlayer 230 to cover the lower wiring 236. The insulation structure 239 may include at least one oxide layer, at least one nitride layer and/or at least one oxynitride layer. In one example embodiment, the insulation structure 239 may include an oxide layer covering the lower wiring 236 and the lower insulating interlayer 230. In another example embodiment, the insulation structure 239 may include an oxide layer and a nitride layer sequentially formed on the lower wiring 236 and the lower insulating interlayer 230. In still another example embodiment, the insulation structure 239 may include a first oxide layer, a nitride layer and a second oxide layer successively formed on the lower insulating interlayer 230 to cover the lower wiring 236. In still another example embodiment, the insulation structure 239 may include a first oxide layer, an oxynitride layer and a second oxide layer. In still another example embodiment, the insulation structure 239 may include a first oxide layer, a second oxide layer, a first nitride layer, a second nitride layer, a first oxynitride layer and/or a second oxynitride layer alternately or sequentially formed on the lower insulating interlayer 230 to cover the lower wiring. Here, the first and the second oxide layers may be formed using silicon oxide, and the first and the second nitride layers may be formed using silicon nitride. Additionally, the first and the second oxynitride layers may be formed using silicon oxynitride or titanium oxynitride.

After a second photoresist pattern (not illustrated) is formed on the insulation structure 239, the insulation structure 239 and the lower insulating interlayer 230 are partially etched to form an opening (not illustrated) exposing the first contact region 221. The opening may be formed an anisotropic etching process.

A diode 242 is formed on the first contact region 221 to fill up the opening. The diode 242 may include polysilicon formed by a selective epitaxial growth (SEG) process. The first contact region 221 may serve as a seed for forming the diode 242. The diode 242 may have a height substantially the same as a depth of the opening. Thus, upper faces of the diode 242 and the insulation structure 239 may be on a same plane. That is, the diode 242 may have a thickness substantially the same as a total thickness of the lower insulating interlayer 230 and the insulation structure 239.

Figure 3C:
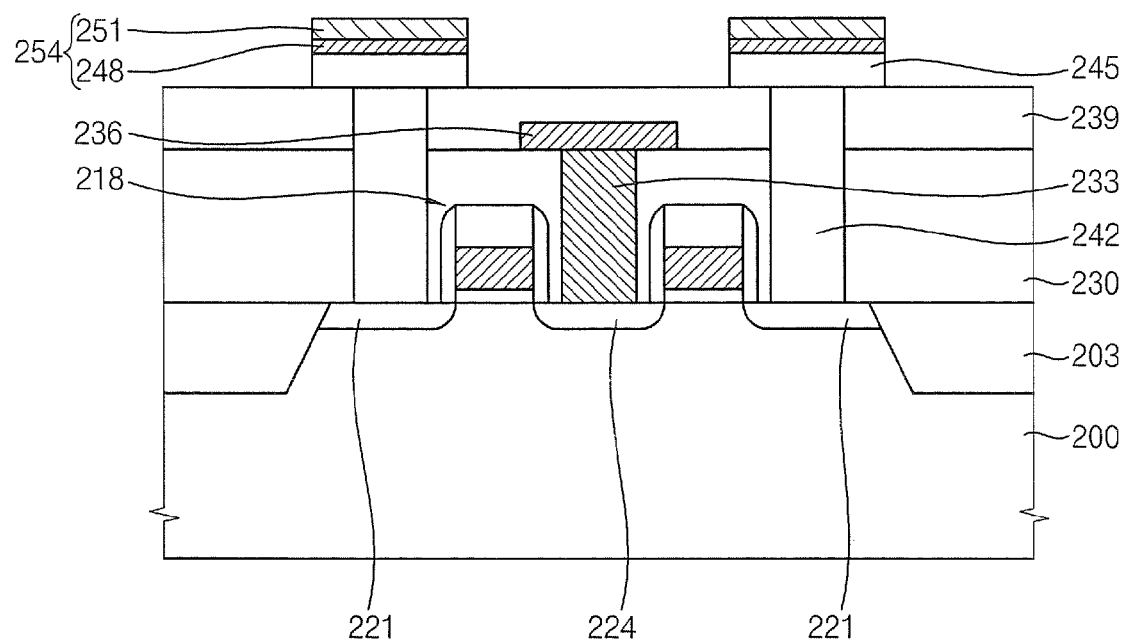

Referring to FIG. 3C, a phase-change material layer (not illustrated) is formed on the diode 242 and the insulation structure 239 by a sputtering process. The phase-change material layer may be formed by a process substantially the same as the process described with reference to FIG. 2C. Thus, the phase-change material layer may include at least one chalcogenide compound according to the above chemical formulae (19) to (23). For example, the phase-change material layer may include a chalcogenide compound containing carbon and metal, or a chalcogenide compound containing carbon, nitrogen and metal.

An upper electrode layer (not illustrated) including a first upper electrode film and a second upper electrode film is formed on the insulation structure 239 and the phase-change material layer. The upper electrode layer may be formed by a process substantially the same as the process described with reference to FIG. 2D. Additionally, the first and the second upper electrode films may be formed using materials substantially the same as those described with reference to FIG. 2D.

After a third photoresist pattern (not illustrated) is formed on the upper electrode layer, the second upper electrode film, the first upper electrode film and the phase-change material layer are patterned using the third photoresist pattern as an etching mask. Thus, a phase-change material layer pattern 248 and an upper electrode 254 are formed on the diode 242 and a portion of the insulation structure 239 around the diode 242. The upper electrode 254 includes a first upper electrode film pattern 248 and a second upper electrode film pattern 251 sequentially formed on the phase-change material layer pattern 248.

Figure 3D:
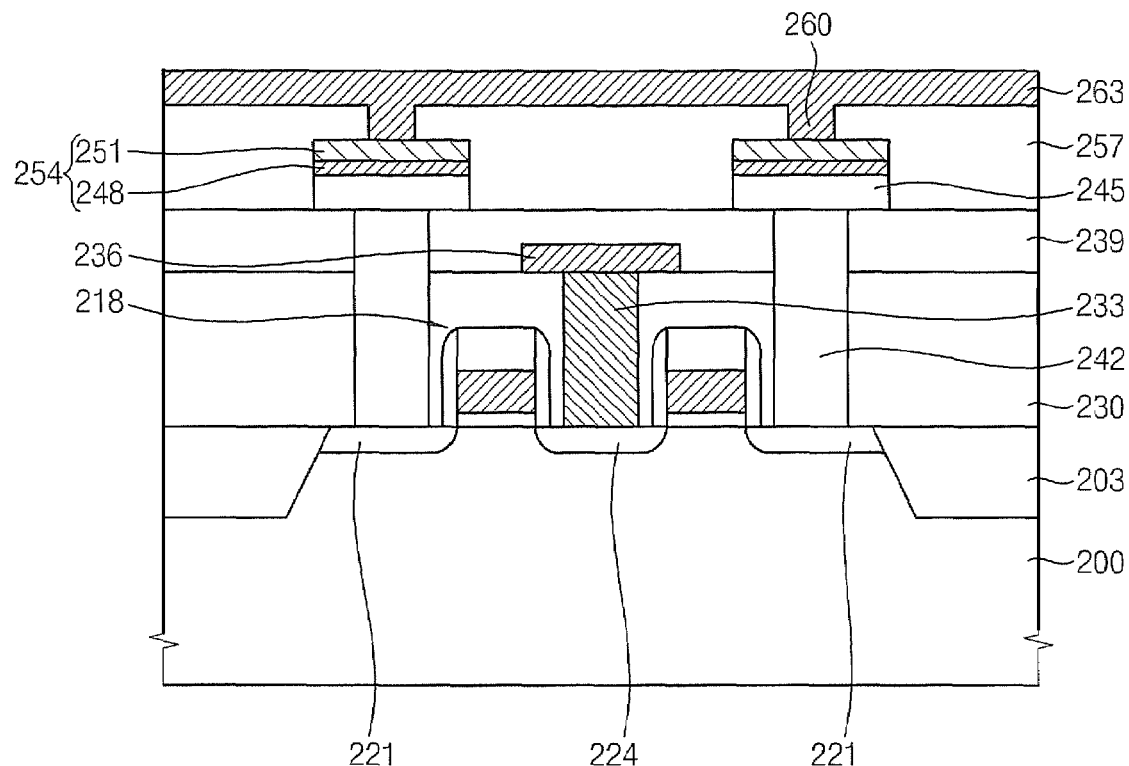

Referring to FIG. 3D, an upper insulating interlayer 257 is formed on the insulation structure 239 to cover the upper electrode 254. The upper insulating interlayer 257 may be formed using an oxide by a CVD process, a PECVD process, an LPCVD process, an HDP-CVD process, etc.

After a fourth photoresist pattern (not illustrated) is formed on the upper insulating interlayer 257, the upper insulating interlayer 257 is partially etched using the fourth photoresist pattern as an etching mask. Hence, an upper contact hole (not illustrated) is formed through the upper insulating interlayer 257 to expose the upper electrode 254.

An upper pad 260 filling the upper contact hole is formed on the upper electrode 254, and an upper wiring 263 is formed on the upper pad 260 and the upper insulating interlayer 257. The upper pad 260 and the upper wiring 263 may be integrally formed each other. For example, upper pad 260 and the upper wiring 263 may be formed using doped polysilicon, metal and/or metal compound by a sputtering process, an LPCVD process, a CVD process, an ALD process, an electron beam evaporation process, a PLD process, etc. The upper wiring 263 may be electrically connected to the upper electrode 254 through the upper pad 260.

Figure 4A:
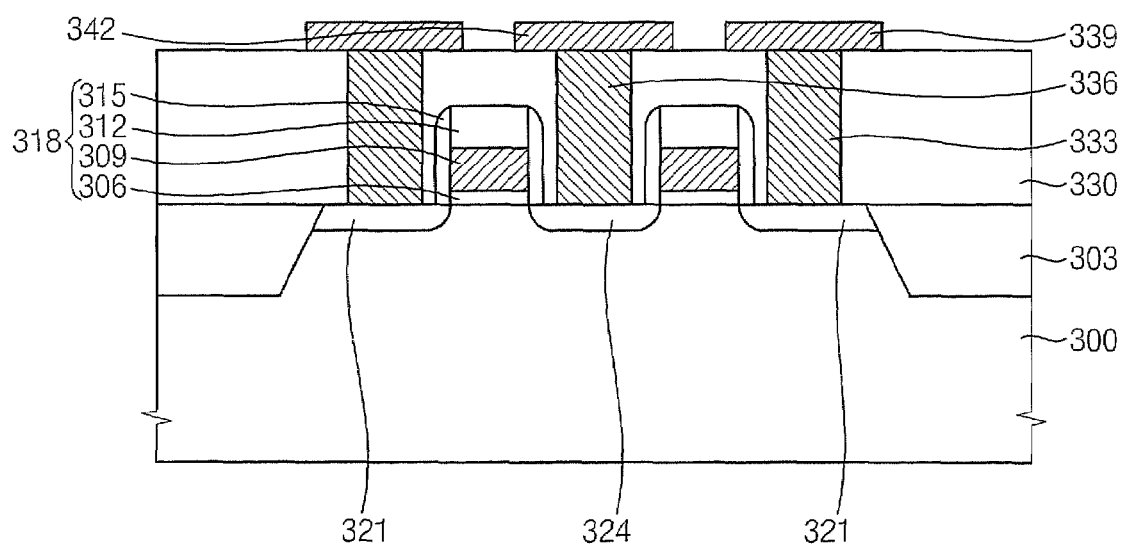
FIGS. 4A to 4C are cross-sectional views illustrating a method of manufacturing a phase-change memory device in accordance with example embodiments of the present invention.
Figure 4B:
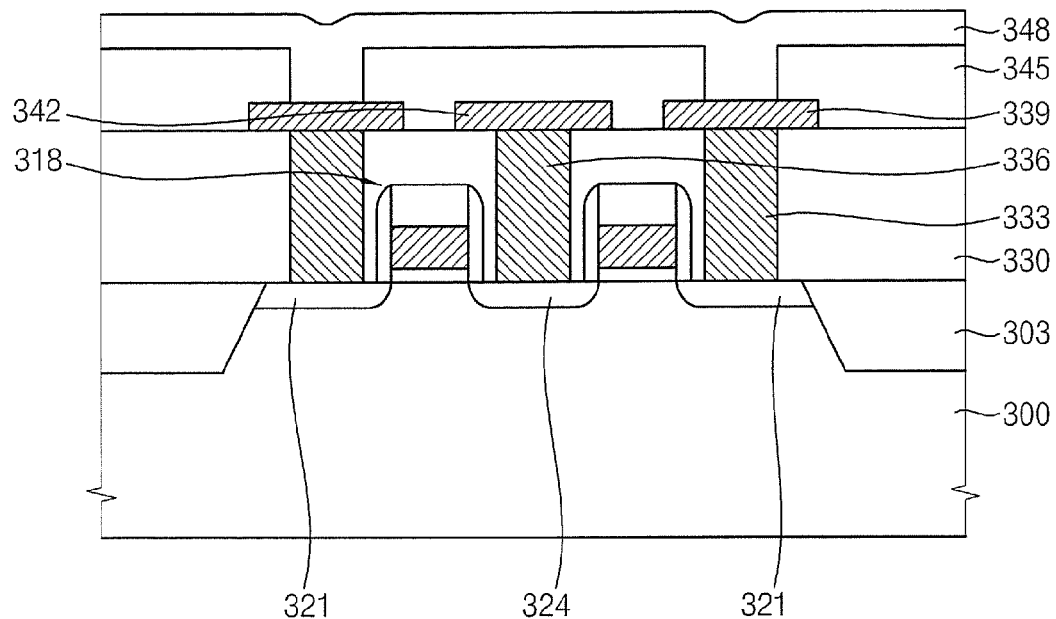
Figure 4C:
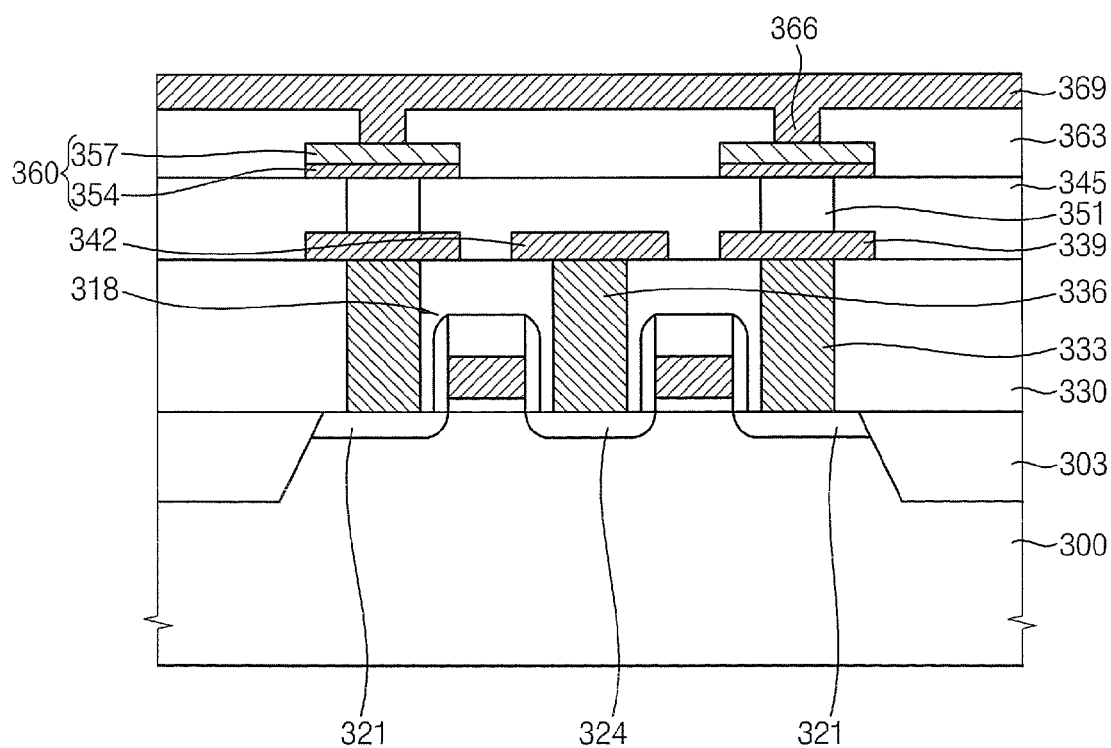

FIGS. 4A to 4C are cross-sectional views illustrating a method of manufacturing a phase-change memory device in accordance with example embodiments of the present invention. In FIGS. 4A to 4C, processes for forming an isolation layer 303, a gate structure 318, a first contact region 321 and a second contact region 324, and a lower insulating interlayer 330 on a substrate 300 may be substantially the same as the processes described with reference to FIG. 2A. The gate structure 318 is formed on an active region of the substrate 300. The gate structure 318 includes a gate insulation layer pattern 306, a gate electrode 309, a gate mask 312 and a gate spacer 315.

Referring to FIG. 4A, the lower insulating interlayer 330 is partially etched to form a first contact hole and a second contact hole (not illustrated) through the lower insulating interlayer 330. The first and the second contact holes expose the first and the second contact regions 321 and 324, respectively.

A first lower conductive layer (not illustrated) is formed on the lower insulating interlayer 330 to fill up the first and the second contact holes. The first lower conductive layer may be formed using metal, metal compound or doped polysilicon by a sputtering process, a CVD process, an LPCVD process, an ALD process, an electron beam evaporation process, a PLD process, etc.

The first lower conductive layer is partially removed until the lower insulating interlayer 330 is exposed so that a first pad 333 and a second pad 336 are formed through the lower insulating interlayer 330. The first pad 333 filling the first contact hole is formed on the first contact region 321, and the second pad 336 filling the second contact hole is positioned on the second contact region 324.

A second lower conductive layer (not illustrated) is formed on the lower insulating interlayer 330, the first pad 333 and the second pad 336. The second lower conductive layer may be formed using metal, metal compound or doped polysilicon by a sputtering process, a CVD process, an LPCVD process, an ALD process, an electron beam evaporation process, a PLD process, etc.

The second lower conductive layer is patterned to form a lower electrode 339 and the lower wiring 342. The lower electrode 339 is formed on the first pad 333 such that the lower electrode 339 may be electrically connected to the first contact region 321 through the first pad 333. The lower wiring 342 is positioned on the second pad 336 so that the lower wiring 342 may make electrically contact with the second contact region 333 through the second pad 336. The lower wiring 342 may include a bit line.

Referring to FIG. 4B, an insulation structure 345 is formed on the lower insulating interlayer 330 to cover the lower electrode 339 and the lower wiring 242. The insulation structure 345 may include at least one oxide layer, at least one nitride layer and/or at least one oxynitride layer.

After a photoresist pattern (not illustrated) is formed on the insulation structure 345, the insulation structure 345 is partially etched using the photoresist pattern as an etching mask. Thus, an opening (not illustrated) exposing the lower electrode 339 is formed through the insulation structure 345. For example, the opening may be formed by an anisotropic etching process.

A phase-change material layer 166 is formed on the lower electrode 160, the spacer 163 and the second insulation layer 148. The phase-change material layer 166 may be formed using a chalcogenide compound by a PVD process or a CVD process.

A phase-change material layer 348 is formed on the lower electrode 339 and the insulation structure 345 to fill up the opening. The phase-change material layer 348 may be formed by a process substantially the same as that described with reference to FIG. 2C. Further, the phase-change material layer 348 may have a composition substantially the same the phase-change material layer 157 illustrated in FIG. 2C.

Referring to FIG. 4C, the phase-change material layer 348 is partially removed until the insulation structure 345 is exposed to form a phase-change material layer pattern 351 on the lower electrode 339. For example, the phase-change material layer pattern 351 may be formed by a chemical mechanical polishing (CMP) process and/or an etch-back process.

A first upper electrode film (not illustrated) and a second upper electrode film (not illustrated) are successively formed on the phase-change material layer pattern 351. The first and the second upper electrode films are patterned to form an upper electrode 360 on the insulation structure 345 and the phase-change material layer pattern 351. The upper electrode includes a first upper electrode film pattern 354 and a second upper electrode film pattern 357. In some example embodiments, each of the lower electrode 339 and the upper electrode 306 may have a width substantially wider than that of the phase-change material layer pattern 351.

An upper insulating interlayer 363 is formed on the insulation structure 345 to cover the upper electrode 360. The upper insulating interlayer 363 may be formed using oxide by a CVD process, a PECVD process, an LPCVD process, an HDP-CVD process, etc. In one example embodiment, the upper insulating layer 363 may be formed using an oxide substantially the same as that of the lower insulating interlayer 330. In another example embodiment, the upper insulating layer 363 and the lower insulating interlayer 330 may be formed using difference oxides, respectively.

The upper insulating interlayer 363 is partially etched by a photolithography process to form an upper contact hole (not illustrated) that exposes the upper electrode 360.

An upper pad 366 is formed on the upper electrode 360 to fill up the upper contact hole, and an upper wiring 369 is formed on the upper pad 366 and the upper insulating layer 363. The upper wiring 369 and the upper pad 366 may be integrally formed each other.

According to the present invention, a chalcogenide compound target may include a chalcogenide compound that contains carbon and metal, or carbon, metal and nitrogen considering contents of carbon, metal and nitrogen. When a phase-change material layer is formed using the chalcogenide compound target by various sputtering processes, the phase transition of the phase-change material layer may be stably repeated and also the phase-change material layer may have enhanced crystallized temperature and resistance. Further, a phase-change memory device may have reduced set resistance and driving current while improving durability and sensing margin when the phase-change material layer is employed in the phase-change memory device.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of this invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of forming a chalcogenide compound target, comprising:
   forming a first powder including germanium carbide;
   forming a second powder including antimony carbide;
   forming a third powder including tellurium carbide;
   forming a powder mixture by mixing the first to the third powders;
   drying the powder mixture;
   forming a shaped body by molding the powder mixture; and
   sintering the shaped body.

2. The method of claim 1, wherein the germanium carbide comprises a composition in accordance with the following chemical formula (9):

$$C_A Ge_{(100-A)} \quad (9)$$

wherein C indicates carbon and $8.0 \leq A \leq 50.0$.

3. The method of claim 1, wherein the germanium carbide comprises a composition according to the following chemical formula (10):

$$C_A[Ge_X Z_{(100-X)}]_{(100-A)} \quad (10)$$

wherein C donates carbon, $8.0 \leq A \leq 50.0$, Z includes silicon (Si) or tin (Sn) and $0.1 \leq X \leq 80.0$.

4. The method of claim 1, wherein the antimony carbide comprises a composition in accordance with the following chemical formula (11):

$$C_A Sb_{(100-A)} \quad (11)$$

wherein C indicates carbon and $8.0 \leq A \leq 50.0$.

5. The method of claim 1, wherein the antimony carbide comprises a composition according to the following chemical formula (12):

$$C_A[Sb_Y T_{(100-Y)}]_{(100-A)} \quad (12)$$

wherein C indicates carbon, $8.0 \leq A \leq 50.0$, T includes arsenic (As) or bismuth (Bi) and $0.1 \leq Y \leq 80.0$.

6. The method of claim 1, wherein the tellurium carbide comprises a composition in accordance with the following chemical formula (13):

$$C_A Te_{(100-A)} \quad (13)$$

wherein C indicates carbon and $4.0 \leq A \leq 20.0$.

7. The method of claim 2, wherein the tellurium carbide comprises a composition according to the following chemical formula (14):

$$C_A Q_{(100-A)} \quad (14)$$

wherein C indicates carbon, $8.0 \leq A \leq 50.0$, Q indicates antimony and selenium.

8. The method of claim 1, further comprising forming a fourth powder including a metal carbide having a composition in accordance with the following chemical formula (15):

$$C_A M_{(100-A)} \quad (15)$$

wherein M indicates metal.

9. The method of claim 8, wherein the metal carbide comprises at least one selected from the group consisting of aluminum carbide, gallium carbide, indium carbide, titanium carbide, chrome carbide, manganese carbide, iron carbide, nickel carbide, cobalt carbide, zirconium carbide, molybdenum carbide, ruthenium carbide, palladium carbide, hafnium carbide, tantalum carbide, iridium carbide and platinum carbide.

10. The method of claim 1, wherein the chalcogenide compound target comprises a chalcogenide compound according to the following chemical formula (16):

$$C_A M_B [Ge_X Sb_Y Te_{(100-X-Y)}]_{(100-A-B)} \quad (16)$$

wherein C indicates carbon, M indicates metal, $8.0 \leq A \leq 40.0$, $0.1 \leq B \leq 20.0$, $0.1 \leq X \leq 30.0$ and $0.1 \leq Y \leq 90.0$.

11. The method of claim 1, wherein the chalcogenide compound target comprises a chalcogenide compound according to the following chemical formula (17):

$$C_A M_B [Ge_X Z_{(100-X)} Sb_Y Te_{(100-X-Y)}]_{(100-A-B)} \quad (17)$$

wherein C indicates carbon, M indicates metal, $8.0 \leq A \leq 40.0$, $0.1 \leq B \leq 20.0$, Z includes silicon or tin, $0.1 \leq X \leq 80.0$, and $0.1 \leq Y \leq 90.0$.

12. The method of claim 1, wherein the chalcogenide compound target comprises a chalcogenide compound according to the following chemical formula (18):

$$C_A M_B [Ge_X Sb_Y T_{(100-Y)} Te_{(100-X-Y)}]_{(100-A-B)} \quad (18)$$

wherein C indicates carbon, M indicates metal, $8.0 \leq A \leq 40.0$, $0.1 \leq B \leq 20.0$, T includes arsenic or bismuth, $0.1 \leq X \leq 90.0$, and $0.1 \leq Y \leq 80.0$.

13. The method of claim 1, wherein the chalcogenide compound target comprises a chalcogenide compound according to the following chemical formula (19):

$$C_A M_B [Ge_X Sb_Y Q_{(100-X-Y)}]_{(100-A-B)} \quad (19)$$

wherein C indicates carbon, M indicates metal, $8.0 \leq A \leq 40.0$, $0.1 \leq B \leq 20.0$, Q includes antimony and selenium, $0.1 \leq X \leq 30.0$, $0.1 \leq Y \leq 90.0$, Q indicates $Sb_D Te_{(100-D)}$, and $0.1 \leq D \leq 80.0$ 14. The method of claim 1, wherein the chalcogenide compound target comprising a chalcogenide compound in accordance with the following chemical formula (20):

$$C_A M_B N_C [Ge_X Sb_Y Te_{(100-X-Y)}]_{(100-A-B-C)} \quad (20)$$

wherein C indicates carbon, M indicates metal, N indicates nitrogen $8.0 \leq A \leq 40.0$, $0.1 \leq B \leq 15.0$, $0.1 \leq C \leq 10.0$, $0.1 \leq X \leq 30.0$ and $0.1 \leq Y \leq 90.0$.

15. The method of claim 1, wherein the chalcogenide compound target comprises a chalcogenide compound according to the following chemical formula (21):

$$C_A M_B N_C [Ge_X Z_{(100-X)} Sb_Y Te_{(100-X-Y)}]_{(100-A-B-C)} \quad (21)$$

wherein C indicates carbon, M indicates metal, N indicates nitrogen $8.0 \leq A \leq 40.0$, $0.1 \leq B \leq 15.0$, $0.1 \leq C \leq 10.0$, Z includes silicon or tin, $0.1 \leq X \leq 80.0$ and $0.1 \leq Y \leq 90.0$.

16. The method of claim 1, wherein the chalcogenide compound target comprises a chalcogenide compound according to the following chemical formula (22):

$$C_A M_B N_C [Ge_X Sb_Y T_{(100-Y)} Te_{(100-X-Y)}]_{(100-A-B-C)} \quad (22)$$

wherein C indicates carbon, M indicates metal, N indicates nitrogen $8.0 \leq A \leq 40.0$, $0.1 \leq B \leq 15.0$, $0.1 \leq C \leq 10.0$, T includes arsenic or bismuth, $0.1 \leq X \leq 90.0$ and $0.1 \leq Y \leq 80.0$.

17. The method of claim 1, wherein the chalcogenide compound target comprises a chalcogenide compound according to the following chemical formula (23):

$$C_A M_B N_C [Ge_X Sb_Y Q_{(100-X-Y)}]_{(100-A-B)} \quad (23)$$

wherein C indicates carbon, M indicates metal, N indicates nitrogen $8.0 \leq A \leq 40.0$, $0.1 \leq B \leq 15.0$, $0.1 \leq C \leq 10.0$, Q includes antimony and selenium, $0.1 \leq X \leq 30.0$, $0.1 \leq Y \leq 90.0$, Q includes antimony and selenium, and $0.1 \leq D \leq 80.0$.

* * * * *